(12) United States Patent
Do et al.

(10) Patent No.: US 12,307,185 B2
(45) Date of Patent: May 20, 2025

(54) INTEGRATED CIRCUIT PROVIDING INCREASED PIN ACCESS POINTS AND METHOD OF DESIGNING THE SAME

(71) Applicant: SAMSUNG ELECTRONICS CO., LTD., Suwon-si (KR)

(72) Inventors: Jungho Do, Hwaseong-si (KR); Jaewoo Seo, Seoul (KR); Sanghoon Baek, Seoul (KR); Jisu Yu, Seoul (KR); Hyeongyu You, Hwaseong-si (KR); Minjae Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 629 days.

(21) Appl. No.: 17/669,631

(22) Filed: Feb. 11, 2022

(65) Prior Publication Data

US 2022/0300693 A1    Sep. 22, 2022

(30) Foreign Application Priority Data

Mar. 18, 2021  (KR) .................. 10-2021-0035386
May 24, 2021  (KR) .................. 10-2021-0066340

(51) Int. Cl.
*G06F 30/394* (2020.01)
*G06F 30/392* (2020.01)

(52) U.S. Cl.
CPC .......... *G06F 30/394* (2020.01); *G06F 30/392* (2020.01)

(58) Field of Classification Search
CPC . G06F 30/394; G06F 30/392; H01L 27/0207; H01L 23/50
See application file for complete search history.

(56) References Cited

U.S. PATENT DOCUMENTS

| | | | |
|---|---|---|---|
| 6,734,472 B2 | 5/2004 | Ho | |
| 8,742,464 B2 | 6/2014 | Sherlekar et al. | |
| 9,024,657 B2 | 5/2015 | Andreev et al. | |
| 9,122,830 B2 | 9/2015 | Yuan et al. | |
| 9,727,685 B2 | 8/2017 | Yuan et al. | |
| 9,977,854 B2 | 5/2018 | Rowhani et al. | |
| 10,083,269 B2 | 9/2018 | De Dood et al. | |
| 10,162,925 B2 | 12/2018 | Chuang et al. | |
| 10,685,982 B2 | 6/2020 | Chou et al. | |
| 10,769,342 B2 | 9/2020 | Sio et al. | |
| 10,776,557 B2 | 9/2020 | Huang et al. | |
| 10,878,165 B2 | 12/2020 | Chang et al. | |
| 2020/0134119 A1* | 4/2020 | Sio | ............. G03F 1/36 |
| 2020/0380193 A1* | 12/2020 | Sio | ......... G06F 30/3947 |
| 2021/0286927 A1* | 9/2021 | Sio | .......... G06F 30/398 |
| 2021/0384186 A1* | 12/2021 | Kim | ......... G06F 30/392 |

* cited by examiner

*Primary Examiner* — Stacy Whitmore
(74) *Attorney, Agent, or Firm* — Sughrue Mion, PLLC

(57) ABSTRACT

An integrated circuit includes a first cell including a first lower pattern extending in a first direction along a first track in a first wiring layer; and a second cell including a second lower pattern that extends in the first direction along the first track in the first wiring layer, and is a minimum space of the first wiring layer or farther apart from the first lower pattern, wherein the first lower pattern corresponds to a pin of the first cell, and the second lower pattern is farther apart from a boundary between the first cell and the second cell than the first lower pattern is.

20 Claims, 28 Drawing Sheets

INTEGRATED CIRCUIT PROVIDING INCREASED PIN ACCESS POINTS AND METHOD OF DESIGNING THE SAME

CROSS-REFERENCE TO RELATED APPLICATIONS

This application is based on and claims priority from Korean Patent Application Nos. 10-2021-0035386, filed on Mar. 18, 2021, and 10-2021-0066340, filed on May 24, 2021, in the Korean Intellectual Property Office, the disclosures of which are incorporated by reference herein in their entireties.

BACKGROUND

The disclosure relates to an integrated circuit, and more particularly, to an integrated circuit providing increased pin access points and a method of designing the same.

Due to the development of semiconductor processes, the size of a device may be reduced, and the number of devices included in an integrated circuit may be increased. An integrated circuit may include patterns for connecting devices, and the patterns may have complex structures due to a high integration and reduced sizes of devices. Therefore, routing for interconnecting devices may be important for performance and efficiency of an integrated circuit.

SUMMARY

The disclosure provides an integrated circuit exhibiting high performance and efficiency by providing increased pin access points and a method of designing the integrated circuit.

According to an aspect of the inventive concept, there is provided an integrated circuit which may include a first cell including a first lower pattern extending in a first direction along a first track in a first wiring layer; and a second cell including a second lower pattern that extends in the first direction along the first track in the first wiring layer, and is apart from the first lower pattern by a minimum space or farther that is allowed by a design rule as a space between two lower patterns extended in a same track on the first wiring layer, wherein the first lower pattern corresponds to a pin of the first cell, and the second lower pattern is farther apart from a boundary between the first cell and the second cell than the first lower pattern is.

According to another aspect of the inventive concept, there is provided an integrated circuit including a first cell including a first lower pattern and a second lower pattern extending in a first direction along a first track and a second track in a first wiring layer, respectively; and a second cell including a third lower pattern and a fourth lower pattern extending in the first direction along the first track and the second track in the first wiring layer, respectively, wherein the first lower pattern is apart from the third lower pattern by a minimum space or farther, and is apart from a boundary between the first cell and the second cell by a first distance or farther, the second lower pattern is apart from the fourth lower pattern by the minimum space or farther and is apart from the boundary by a second distance or farther, and the first distance is different from the second distance.

According to another aspect of the inventive concept, there is provided a method of designing an integrated circuit, the method including obtaining input data that defines a plurality of cells and connections between the cells; placing the cells based on the input data; routing a plurality of pins of the cells based on the input data; and generating output data that defines a layout of the integrated circuit, wherein the routing the pins includes extending a first lower pattern, which corresponds to a pin of a first cell and extends in a first direction in a first wiring layer; disposing a via at one of a plurality of pin access points including a pin access point of an extended portion of the first lower pattern; and generating a first upper pattern, which is connected to the via and extends in a second direction perpendicular to the first direction in a second wiring layer.

According to another aspect of the inventive concept, there is provided an integrated circuit including a first cell including a plurality of lower patterns extending in a first direction in a first wiring layer and at least one gate electrode extending in a second direction perpendicular to the first direction with a first pitch; a filler cell disposed adjacent to the first cell and having a width which is the same as the first pitch; a second cell disposed adjacent to the filler cell; and a plurality of upper patterns extending in the second direction along a plurality of tracks with a second pitch in a second wiring layer, wherein the second pitch is smaller than the first pitch, and the plurality of lower patterns include a first lower pattern extending to intersect with a first track of the plurality of tracks over the filler cell.

BRIEF DESCRIPTION OF DRAWINGS

Embodiments of the inventive concept will be more clearly understood from the following detailed description taken in conjunction with the accompanying drawings in which.

DETAILED DESCRIPTION

Figure 1A:
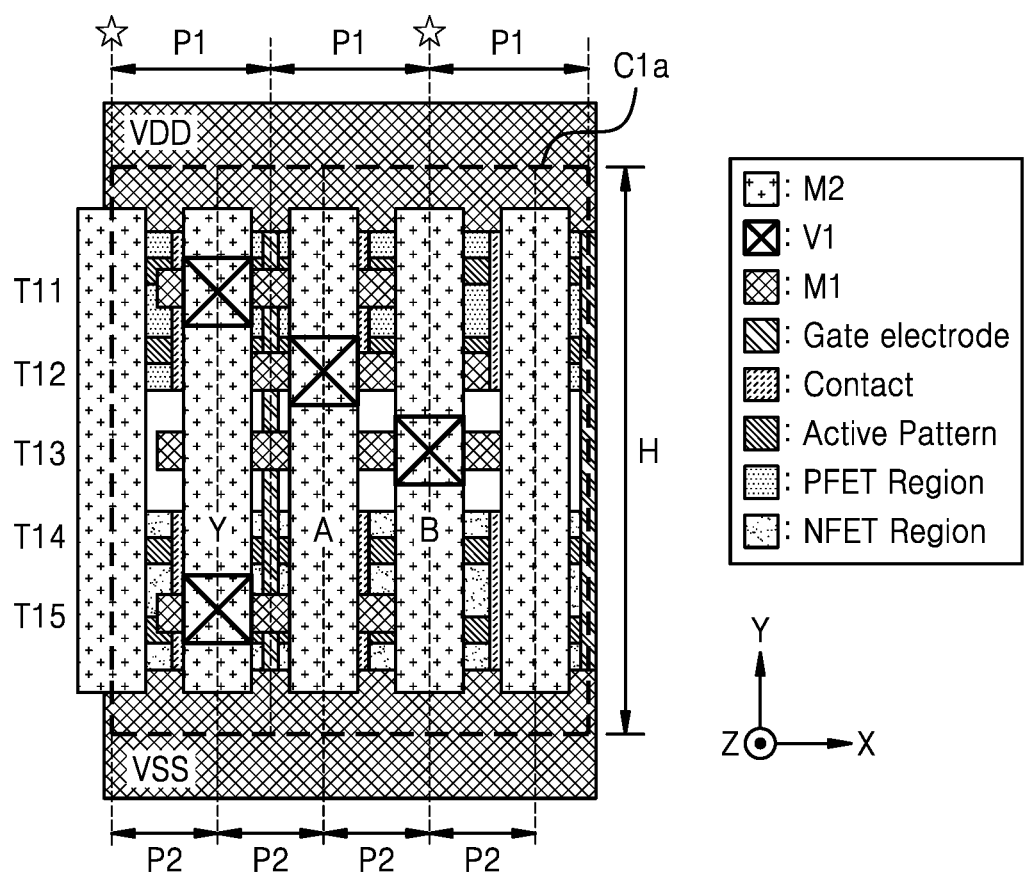
FIGS. 1A to 1D are plan views of examples of a layout of an integrated circuit, according to embodiments.

All of the embodiments described herein are example embodiments, and thus, the inventive concept is not limited thereto and may be realized in various other forms.

FIGS. 1A to 1D are plan views of examples of a layout of an integrated circuit, according to embodiments. In detail, FIGS. 1A to 1D are schematic plan views of layouts including NAND2 cells C1a, C1b, C1c, and C1d corresponding to a 2-input NAND gate that generates outputs from two inputs and wires extending on the NAND2 cells C1a, C1b, C1c, and C1d on a plane including the X axis and the Y axis.

Herein, the X-axis direction and the Y-axis direction may be referred to as a first direction and a second direction, respectively, and the Z-axis direction may be referred to as a third direction or a vertical direction. A plane including an X-axis and a Y-axis may be referred to as a horizontal plane, components placed in the +Z direction relative to other components may be referred to as being above the other components, and components placed in the −Z direction relative to other components may be referred to as being below the other components. Also, an area of a component may refer to a size occupied by the component in a plane parallel to the horizontal plane, and a width of a component may refer to a length of the component in a direction perpendicular to the direction in which the component extends. Also, when components are coupled or electrically connected, the components may be simply referred to as being connected. In the drawings, only some layers may be shown for convenience of illustration, and, to indicate a connection between an upper pattern and a lower pattern of different wiring layers, a via may be shown on the upper pattern even though the via is located below the upper pattern. Further, a pattern consisting of a conductive material like a pattern of a wiring layer may be referred to as a conductive pattern or may be simply referred to as a pattern.

An integrated circuit may include a plurality of cells. A cell is a unit of a layout included in an integrated circuit, may be designed to perform a predefined function, and may also be referred to as a standard cell. An integrated circuit may include a plurality of various types of cells, and cells may be aligned and placed in a plurality of rows. For example, as shown in FIGS. 1A to 1D, the NAND2 cells C1a, C1b, C1c, and C1d may each have a length H in the Y-axis direction and may be placed in a row having a width H and extending in the X-axis direction. A cell like the NAND2 cells C1a, C1b, C1c, and C1d placed in a single row may be referred to as a single height cell, whereas, a cell continuously disposed across two or more rows adjacent to one another (e.g., a cell C08 of FIG. 6) may be referred to as a multiple height cell.

As shown in FIGS. 1A to 1D, patterns for supplying a positive supply voltage VDD and a negative supply voltage VSS (or ground potential) to the NAND2 cells C1a, C1b, C1c, and C1d may extend in the X-axis direction along boundaries of a row. These patterns may be referred to as power rails. Also, an active region in which a P-type transistor is formed and an active region in which an N-type transistor is formed may extend in the X-axis direction in parallel to each other within a row. As shown in FIGS. 1A to 1D, at least one active pattern may extend in the X-axis direction in an active region, and the active pattern may intersect with a gate electrode extending in the Y-axis direction and form a transistor.

In some embodiments, when a fin-type active pattern extends in the X-axis direction, the active pattern and a gate electrode may form a fin field effect transistor (FinFET). Various embodiments described herein are directed to structures including FinFETs, but it would be obvious that these embodiments may also be applied to structures including transistors different from FinFETs. For example, an active pattern may include a plurality of nanowires apart from one another in the Z-axis and/or Y-axis direction and extending in the X-axis direction, and a cell may include a gate all around FET (GAAFET) formed by the nanowires and a gate electrode. Also, an active pattern may include a plurality of nanosheets that are spaced from one another in the Z-axis and/or Y-axis direction and extend in the X-axis direction, and a cell may include a multi-bridge channel FET (MBCFET) formed by the nanosheets and a gate electrode. Also, a cell may include a ForkFET in which nanosheets for a P-type transistor and nanosheets for an N-type transistor are separated from each other by a dielectric wall, and thus, an N-type transistor and a P-type transistor have structures close to each other. Also, a cell may include a vertical FET (VFET) having a structure in which source/drain regions are spaced apart from each other in the Z-axis direction with a channel region therebetween, and a gate electrode surrounds the channel region. Also, a cell may include a field effect transistor (FET) like a complementary FET (CFET), a negative CFET (NCFET), and a carbon nanotube (CNT) FET and may also include a bipolar junction transistor and other 3D transistors.

In an integrated circuit, a cell may include pins connected to elements outside the cell. For example, the NAND2 cells C1a, C1b, C1c, and C1d may include patterns extending in the X-axis direction in an M1 layer, which is a wiring layer, and these patterns may include input pins for receiving input signals A and B and an output pin for outputting an output signal Y. At least one of these pins may be connected to a pattern extending in the Y-axis direction in an M2 layer, which is an upper wiring layer above the M1 layer, through a via on the pin (that is, a via of a V1 layer). In some embodiments, patterns extending in one wiring layer may have directionality. For example, as shown in FIGS. 1A to 1D, patterns in the M1 layer may extend in the X-axis direction along first to fifth X-tracks T11 to T15, and patterns in the M2 layer may extend in the Y-axis direction. Herein, the M1 layer may be referred to as a lower wiring layer, and the patterns extending in the X-axis direction in the M1 layer may be referred to as lower patterns. Also, the M2 layer may be referred to as an upper wiring layer, and the patterns extending in the Y-axis direction in the M2 layer may be referred to as upper patterns.

In some embodiments, in a wiring layer, patterns may extend in the Y-axis direction at a pitch different from a contacted poly pitch (CPP), that is, a pitch of gate electrodes extending in the Y-axis direction. For example, as shown in FIGS. 1A to 1D, gate electrodes may extend in the Y-axis direction with a first pitch P1, and patterns in the M2 layer may extend in the Y-axis direction with a second pitch P2 that is smaller than the first pitch P1. Therefore, even on the same cell, upper patterns may be disposed in various ways. In other words, Y-tracks along which the upper patterns extend may be disposed on the same cell in various ways. Although FIGS. 1A to 1D show upper patterns differently disposed on the same cells, that is, the NAND2 cells C1a, C1b, C1c, and C1d, the embodiments are not limited to the upper patterns shown in FIGS. 1A to 1D. Also, examples in which a ratio between the first pitch P1 (or a CPP) and the second pitch P2 is 3:2 will be described below, but the embodiments may be applied to other ratios (e.g., 4:3).

Figure 1B:
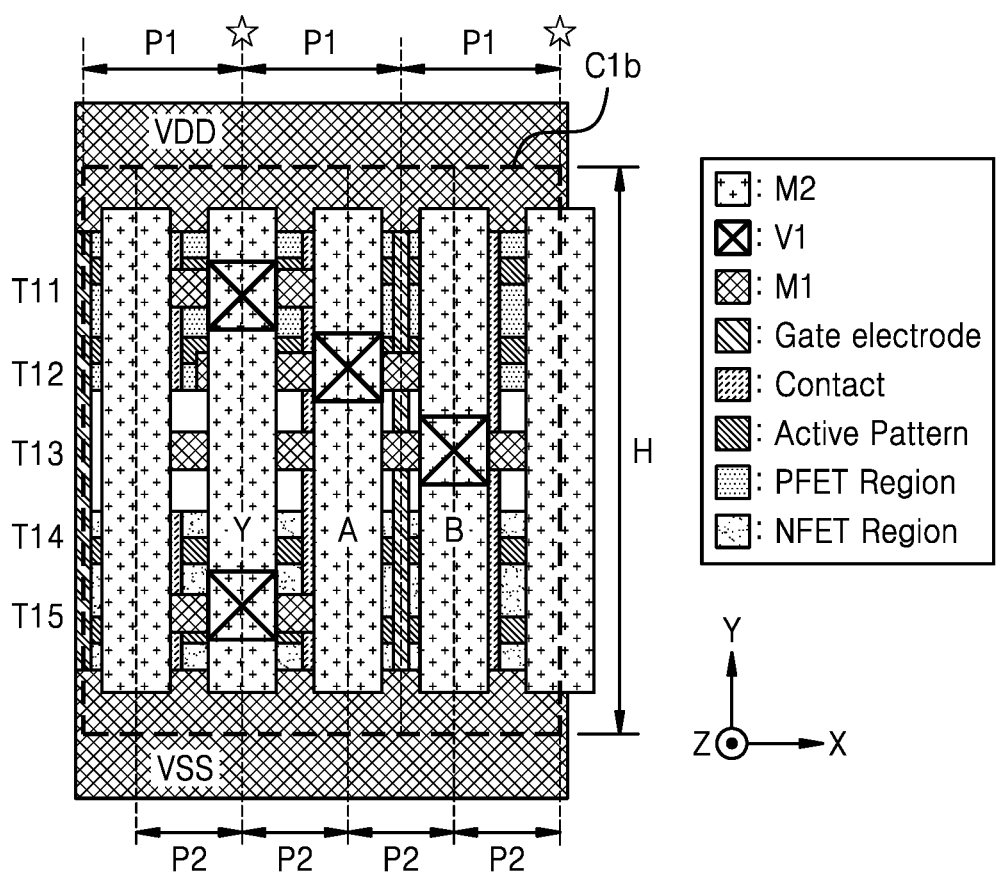

Referring to FIGS. 1A and 1B, upper patterns may include upper patterns aligned with gate electrodes. Herein, aligned components may have center axes overlapping in the Z-axis direction. For example, two patterns among five patterns of the M2 layer shown in FIG. 1A may be aligned with gate electrodes at the two points indicated by stars, while the remaining three patterns of the M2 layer are not aligned with the gate electrodes. Also, two patterns among five patterns of the M2 layer shown in FIG. 1B may be aligned with gate electrodes at the two points indicated by stars, while the remaining three patterns of the M2 layer are not aligned with the gate electrodes.

Figure 1C:
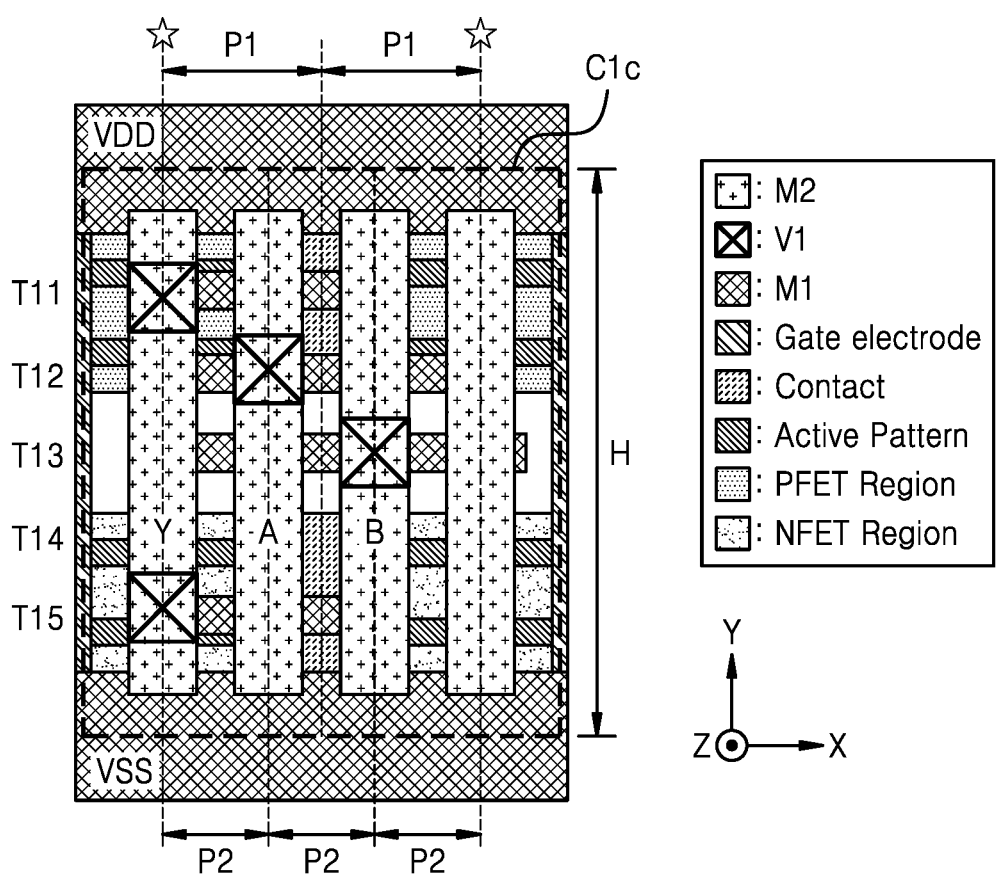
Figure 1D:
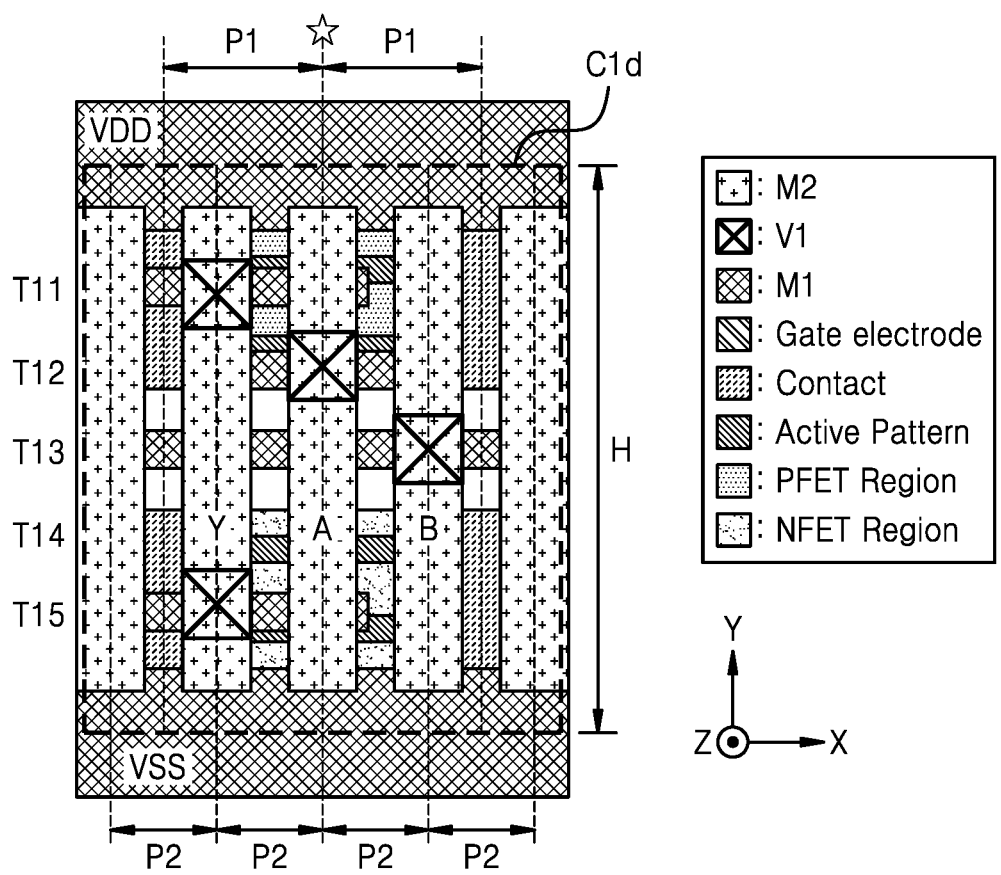

Referring to FIGS. 1C and 1D, upper patterns may include upper patterns aligned with source/drain contacts. Source/drain contacts may be disposed between gate electrodes, and thus, as shown in FIGS. 1C and 1D, the source/drain contacts may extend in the second direction with the first pitch P1. For example, two patterns among four patterns of the M2 layer shown in FIG. 1C may be aligned with source/drain contacts at the two points indicated by stars, while the remaining two patterns of the M2 layer are not aligned with the source/drain contacts. Also, one pattern among five patterns of the M2 layer shown in FIG. 1D may be aligned with a source/drain contact at the point indicated by a star, while the remaining four patterns of the M2 layer are not aligned with source/drain contacts.

As described above, a lower pattern corresponding to a pin of a cell may be connected to an upper pattern through a via disposed on the lower pattern. The location of a via disposed on the pin may depend on a location at which the upper pattern extends. For example, as shown in FIGS. 1A to 1C, when upper patterns are disposed differently, vias of the V1 layer may also be disposed differently. Therefore, locations at which vias can be possibly disposed, that is, pin access points may vary according to arrangements of upper patterns. Reduction of pin access points may cause routing congestion when pins of a cell are connected, and the routing congestion may cause not only delays of signals, but also increase of an area of an integrated circuit.

As described below with reference to the attached drawings, according to an embodiment, pin access points may increase, and thus, routing congestion may decrease in an integrated circuit. Also, delays of signals may decrease due to the decreased routing congestion, and thus, performance of the integrated circuit may be improved. Also, an area for routing may be reduced due to the decreased routing congestion, and thus, efficiency of the integrated circuit may be improved. Also, routing may be easily performed during a process of designing an integrated circuit, and thus, time to market of integrated circuit may be reduced.

Figure 2:
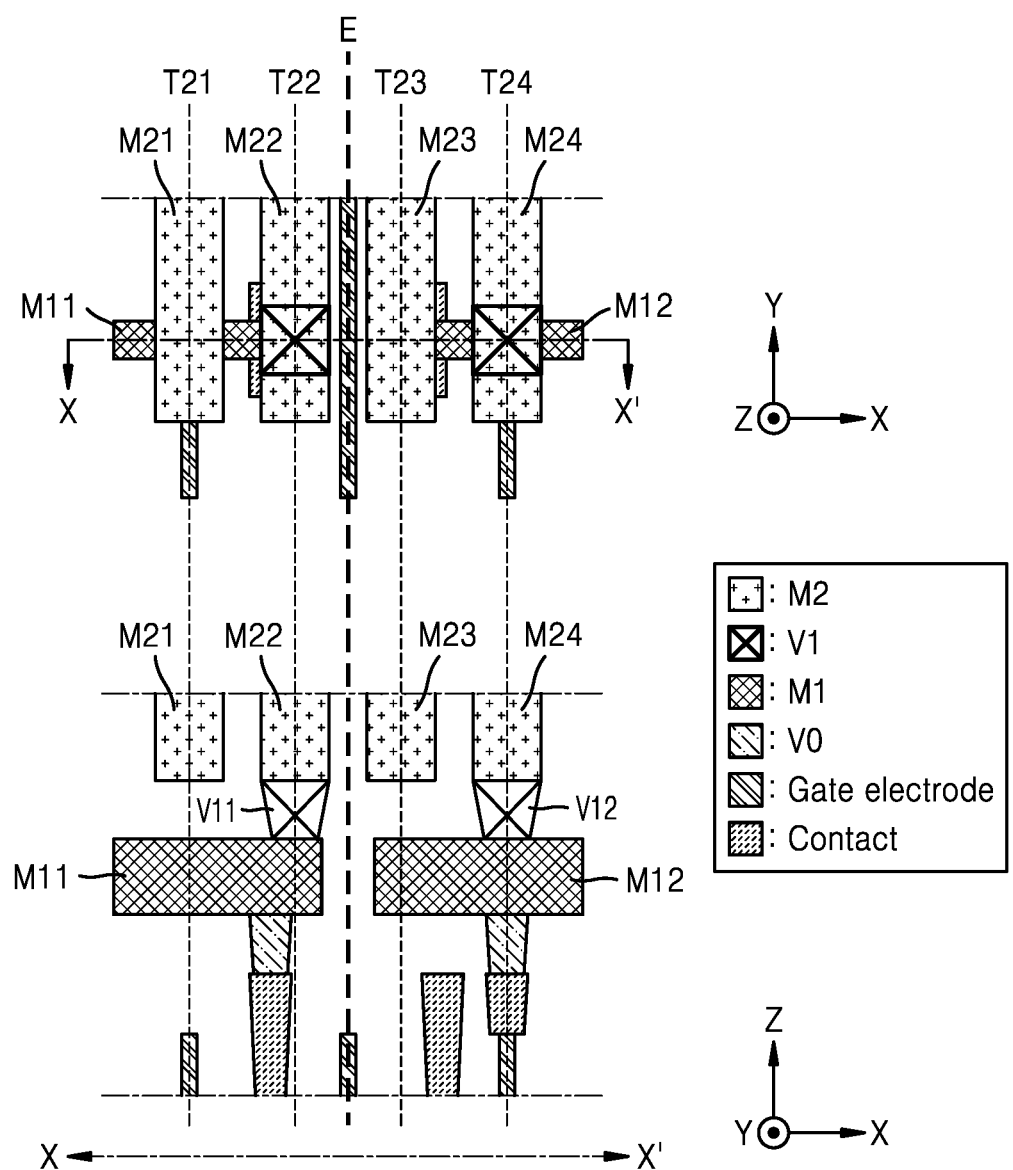
FIG. 2 is a diagram showing the layout of an integrated circuit, according to an embodiment.

FIG. 2 is a diagram showing the layout of an integrated circuit, according to an embodiment. In detail, the upper portion of FIG. 2 shows a layout around a boundary E between cells included in an integrated circuit on a plane including the X axis and the Y axis, whereas the lower portion of FIG. 2 shows a cross-section obtained along a line X-X' shown the upper portion of FIG. 2.

Referring to FIG. 2, first and second lower patterns M11 and M12 may extend in the X-axis direction along the same X-track. The first and second lower patterns M11 and M12 may be pins included in different cells, respectively. As shown in FIG. 2, the first and second lower patterns M11 and M12 may be apart from each other in the X-axis direction. In some embodiments, the first and second lower patterns M11 and M12 may be formed by splitting one lower pattern extending in the X-axis direction through an M1 cut, and the first and second lower patterns M11 and M12 may be apart from each other by a minimum space within the same X-track of an M1 layer. Also, the first and second lower patterns M11 and M12 may be apart from a boundary E of two adjacent cells by the same distance.

First to fourth upper patterns M21 to M24 may extend in the Y-axis direction along first to fourth Y-tracks T21 to T24 in an M2 layer. For connection between the first lower pattern M11 and the second upper pattern M22, a first via V11 may be disposed at a point at which the first lower pattern M11 intersects with a second track T22. Also, for connection between a second lower pattern M12 and a fourth upper pattern M24, a second via V12 may be disposed at a point at which the second lower pattern M12 intersects with a fourth Y-track T24.

A pattern of a wiring layer may be required to extend by a certain length or longer in both directions around a via for reliable connection with the via, and the extended portion of the pattern may be referred to as a via overlap. When a via overlap is not secured, a pattern and/or a via may not be formed as designed during a semiconductor process, and thus, a connection between the pattern and the via may become unreliable. Referring to FIG. 2, the second via V12 may be located on the fourth Y-track T24 far from the boundary E, and thus, the second lower pattern M12 may provide a via overlap (that is, an M1-V1 overlap). On the other hand, the first via V11 may be located on the second Y-track T22 close to the boundary E, and thus, no via overlap may be secured due to the first lower pattern M11 apart from the boundary E. Therefore, a point at which the first lower pattern M11 intersects with the second Y-track T22 may not be used as a pin access point, and a point at which the second lower pattern M12 intersects with a third Y-track T23 may also not be used as a pin access point.

As described below with reference to the attached drawings, according to an embodiment, the second lower pattern M12 may be shortened in the X-axis direction, and the first lower pattern M11 may extend in the X-axis direction. Therefore, a via overlap for the first via V11 may be secured, and a point at which an extended portion of the first lower pattern M11 intersects with the second Y-track T22 may be used as a pin access point.

Figure 3:
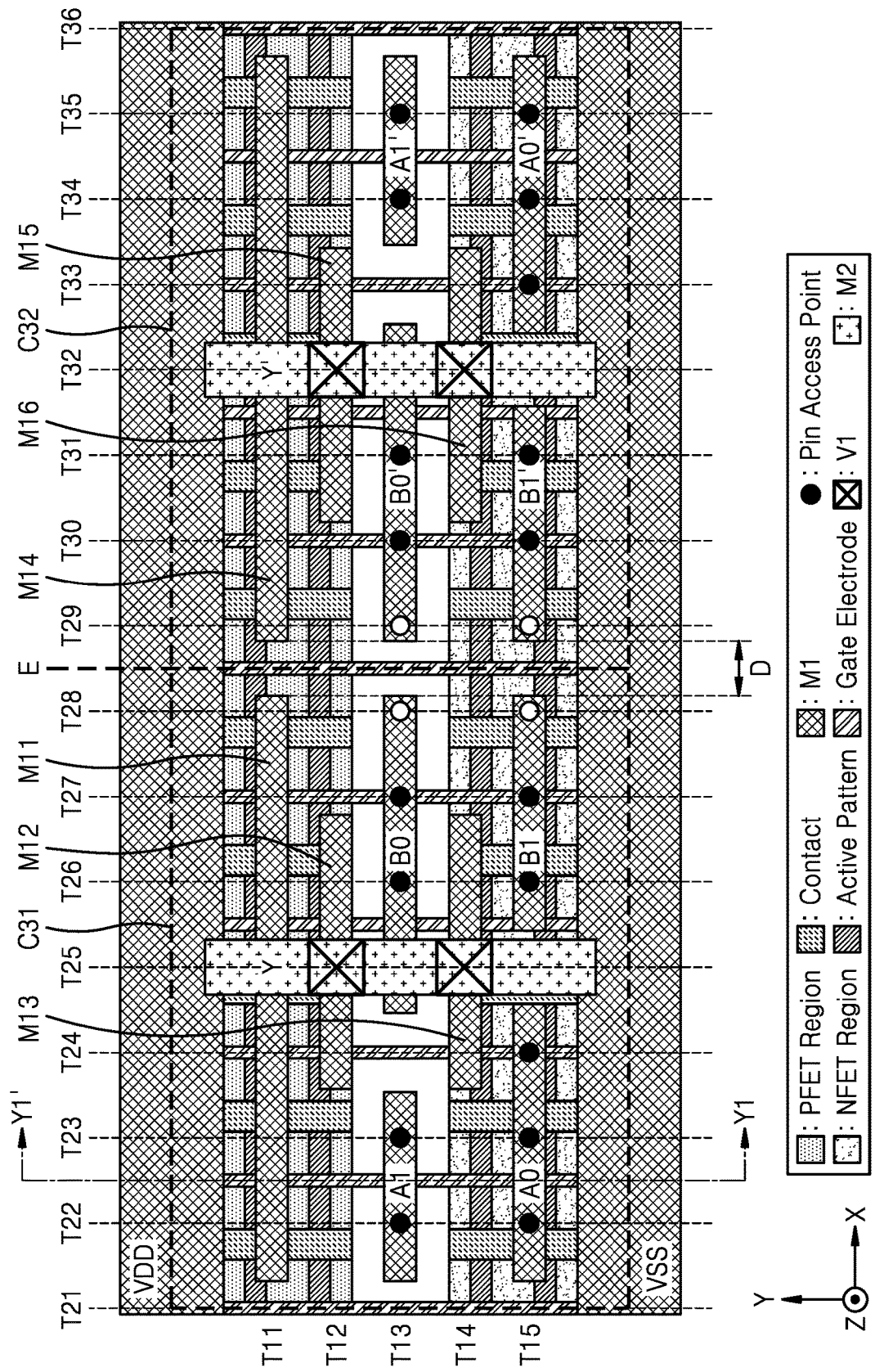
FIG. 3 is a plan view of the layout of an integrated circuit, according to an embodiment.

FIG. 3 is a plan view of the layout of an integrated circuit, according to an embodiment. In detail, FIG. 3 is a plan view of a layout including first and second AOI22 cells C31 and C32 adjacent to each other. As shown in FIG. 3, the first and second AOI22 cells C31 and C32 may be placed adjacent to each other in the same row and may have symmetrical structures. As shown in FIG. 3, lower patterns may extend in the X-axis direction along first to fifth X-tracks T11 to T15 of an M1 layer, and upper patterns may extend in the Y-axis direction along first to sixteenth Y-tracks T21 to T36 of an M2 layer.

A first AOI22 cell C31 may include four input pins A0, A1, B0, and B1 and one output pin Y. As shown in FIG. 3, two input pins A1 and B0 may extend in the X-axis direction along the third track T13 of the M1 layer, the other two input pins A0 and B1 may extend in the X-axis direction along the fifth track T15 of the M1 layer, and an output pin Y may extend in the Y-axis direction along the fifth Y-track T25 of the M2 layer. Also, a second AOI22 cell C32 may include four input pins A0', A1', B0', and B1' and one output pin Y'. As shown in FIG. 3, two input pins A1' and B0' may extend in the X-axis direction along the third X-track T13 of the M1 layer, the other two input pins A0' and B1' may extend in the X-axis direction along the fifth X-track T15 of the M1 layer, and an output pin Y' may extend in the Y-axis direction along the twelfth Y-track T32 of the M2 layer.

The number of pin access points may be important to route cells including a plurality of pins like the first AOI22 cell C31 and the second AOI22 cell C32 within a limited area. As indicated by solid circles (•) in FIG. 3, in the first AOI22 cell C31, an input pin A0 may have three pin access points, and each of the other input pins A1, B0, and B1 may each have two pin access points. Similarly, in the second AOI22 cell C32, an input pin A0' may have three pin access points, and each of the other input pins A1, B0, and B1 may each have two pin access points.

An input pin B0 of the first AOI22 cell C31 and an input pin B0' of the second AOI22 cell C32 extending on the third X-track T13 of the M1 layer may be apart from each other by a distance D around a boundary E between the first and second AOI22 cells C31 and C32. Also, an input pin B1 of the first AOI22 cell C31 and an input pin B1' of the second AOI22 cell C32 extending on the fifth X-track T15 of the M1 layer may also be apart from each other by the distance D around the boundary E. In some embodiments, the distance D may be equal to or greater than the minimum space within the same track of the M1 layer.

As described above with reference to FIG. 2, a point at which pins do not provide a sufficient via overlap may not be usable as a pin access point. For example, as indicated by empty circles (○) in FIG. 3, points at which the input pins B0 and B1 of the first AOI22 cell C31 intersect with an eighth track T28 of the M2 layer may not be usable as pin access points. Also, points at which the input pins B0' and B1' of the second AOI22 cell C32 intersect with a ninth track T29 of the M2 layer may not be usable as pin access points. Therefore, upper patterns extending along the eighth Y-track T28 and the ninth Y-track T29 of the M2 layer may not be used for routing pins of the first and second AOI22 cells C31 and C32, and thus, routing freedom may be limited.

In some embodiments, lower patterns of the M1 layer may be formed through multi-patterning, and thus, a pitch of the lower patterns may be reduced. For example, lower patterns of a first group extending along the first X-track T11, the third X-track T13, and the fifth X-track T15 of the M1 layer may be simultaneously formed, and lower patterns of a second group extending along the second X-track T12 and the fourth X-track T14 of the M1 layer may be simultaneously formed.

In some embodiments, an M1 cut may be used to separate lower patterns of some groups of a plurality of groups of lower patterns, and thus, a process of manufacturing an integrated circuit may be simplified. For example, the input pin B0 of the first AOI22 cell C31 and the input pin B0' of the second AOI22 cell C32, which are lower patterns of the first group, may be formed as a single lower pattern and separated thereafter from each other by an M1 cut, thus being apart from each other by the distance D as shown in FIG. 3. On the other hand, lower patterns M12 and M13 of the first AOI22 cell C31 and lower patterns M15 and M16 of the second AOI22 cell C32, which are lower patterns of the second group, may be simultaneously formed through at least one sub-process, thus being apart from each other by a distance greater than the distance D as shown in FIG. 3.

In some embodiments, two or more lower patterns of the same group may be separated from each other by a common M1 cut, that is, an M1 cut having a shape extending in the Y-axis direction. For example, one M1 cut extending along the boundary E in the Y-axis direction may be used for the input pints B0 and B1 and a lower pattern M11 of the first AOI22 cell C31 and the input pins B0' and B1' and a lower pattern M14 of the second AOI22 cell C32.

Figure 4A:
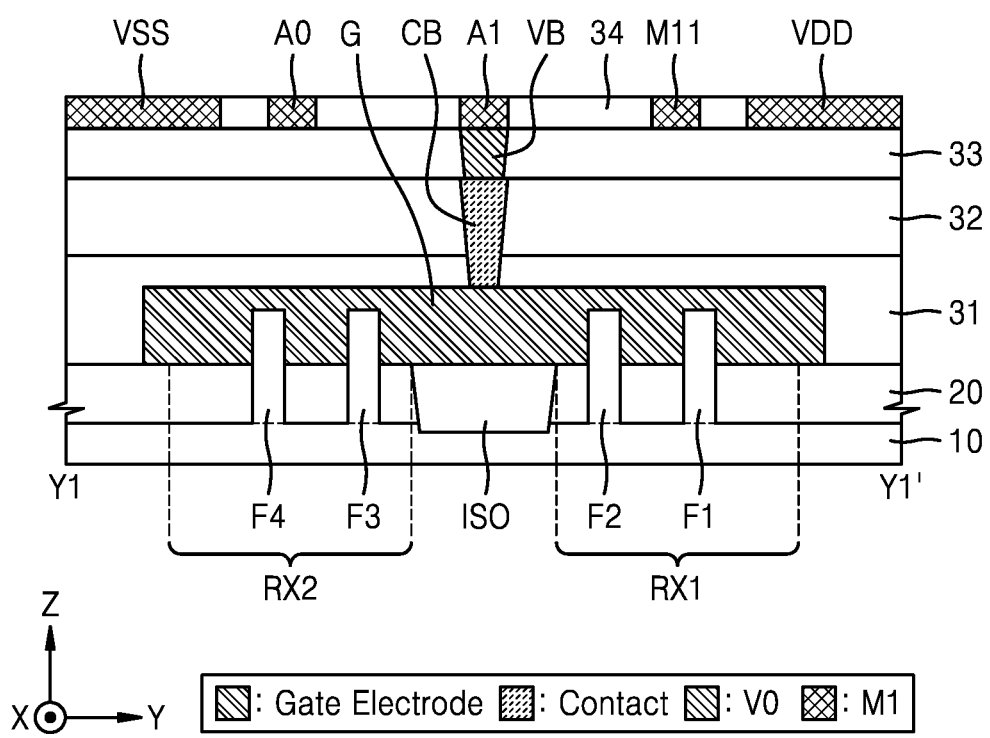
FIGS. 4A and 4B are cross-sectional views of examples of the layout of an integrated circuit, according to embodiments.
Figure 4B:
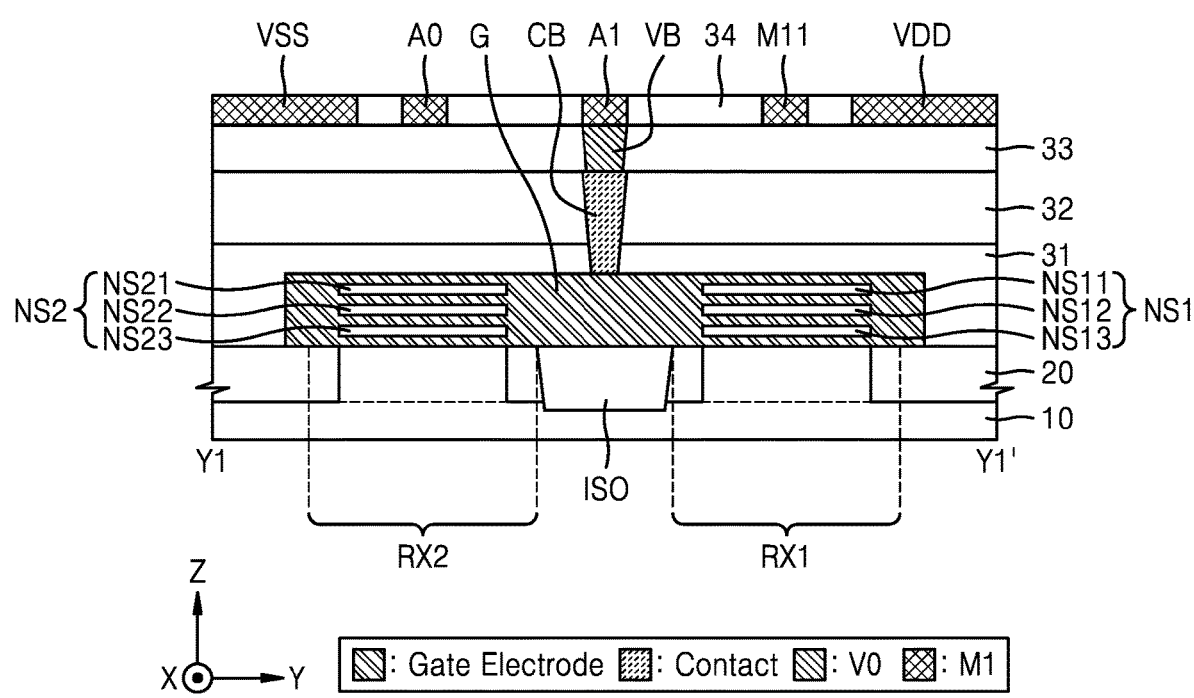

FIGS. 4A and 4B are cross-sectional views of examples of a layout of an integrated circuit, according to embodiments. In detail, FIGS. 4A and 4B show examples of different cross-sections of the integrated circuit of FIG. 3 along a line Y1-Y1'. Although not shown in FIGS. 4A and 4B, gate spacers may be formed on side surfaces of a gate electrode, and gate dielectric layers may be formed between the gate electrode and the gate spacer, and on the bottom surface of the gate electrode. Also, a barrier layer may be formed on a surface of a contact and/or a via. Hereinafter, descriptions of FIGS. 4A and 4B identical to each other will be omitted.

In some embodiments, an integrated circuit may include a FinFET. Referring to FIG. 4A, a substrate 10 may include bulk silicon or a silicon-on-insulator (SOI) and, as non-limiting examples, may include SiGe, silicon germanium on insulator (SGOI), InSb, a PbTe compound, InAs, phosphide, GaAs, or GaSb. A field insulation layer 20 may be formed on the substrate 10. As non-limiting examples, the field insulation layer 20 may include $SiO_2$, SiN, SiON, SiOCN, or combinations of two or more thereof. In some embodiments, the field insulation layer 20 may surround some of side surfaces of an active pattern, that is, a fin, as shown in FIG. 4A. First to fourth interlayer insulation layers 31 to 34 may be formed in the field insulation layer 20.

First to fourth fins F1 to F4 may extend in the X-axis direction on the field insulation layer 20. A device isolation layer ISO may extend in the X-axis direction between first and second fins F1 and F2 and third and fourth fins F3 and F4, and first and second active regions RX1 and RX2 may be separated from each other by the device isolation layer ISO. The first to fourth fins F1 to F4 may pass through the field insulation layer 20 and intersect with a gate electrode G extending in the Y-axis direction. In some embodiments, the number of fins in the integrated circuit may be different from the number of fins shown in FIG. 4A.

The gate electrode G may include, as non-limiting examples, Ti, Ta, W, Al, Co, or combinations of two or more thereof or may include non-metals like Si or SiGe. Also, the gate electrode G may be formed by stacking two or more conductive materials. For example, the gate electrode G may include a work function-adjusting layer including TiN, TaN, TiC, TaC, TiAlC, or combinations of two or more thereof and a filling conductive layer including W or Al. A gate contact CB may pass through a second interlayer insulation layer 32 and be connected to the gate electrode G, and a gate via VB may pass through a third interlayer insulation layer 33 and be connected to the gate contact CB and an input pin A1. Therefore, the input pin A1 may be electrically connected to the gate electrode G through the gate via VB and the gate contact CB. In some embodiments, unlike as shown in FIG. 4A, the gate contact CB may be omitted, and the input pin A1 may be electrically connected to the gate electrode G through a gate via passing through the second interlayer insulation layer 32 and the third interlayer insulation layer 33.

In some embodiments, the integrated circuit may include a transistor having a gate all around (GAA) structure in which a nanowire or a nanosheet is surrounded by a gate electrode. For example, as shown in FIG. 4B, in a first active region RX1, a first nanosheet stack NS1 including three nanosheets NS11, NS12, and NS13 may pass through the gate electrode G and extend in the X-axis direction. The first nanosheet stack NS1 may be doped with an N-type impurity and may form a PFET. Also, in a second active region RX2, a second nanosheet stack NS2 including three nanosheets NS21, NS22, and NS23 may pass through the gate electrode G and extend in the X-axis direction. The second nanosheet stack NS2 may be doped with a P-type impurity and constitute an NFET. In some embodiments, the number of nanosheets in a nanosheet stack may be different from the number of nanosheets shown in FIG. 4B.

Figure 5A:
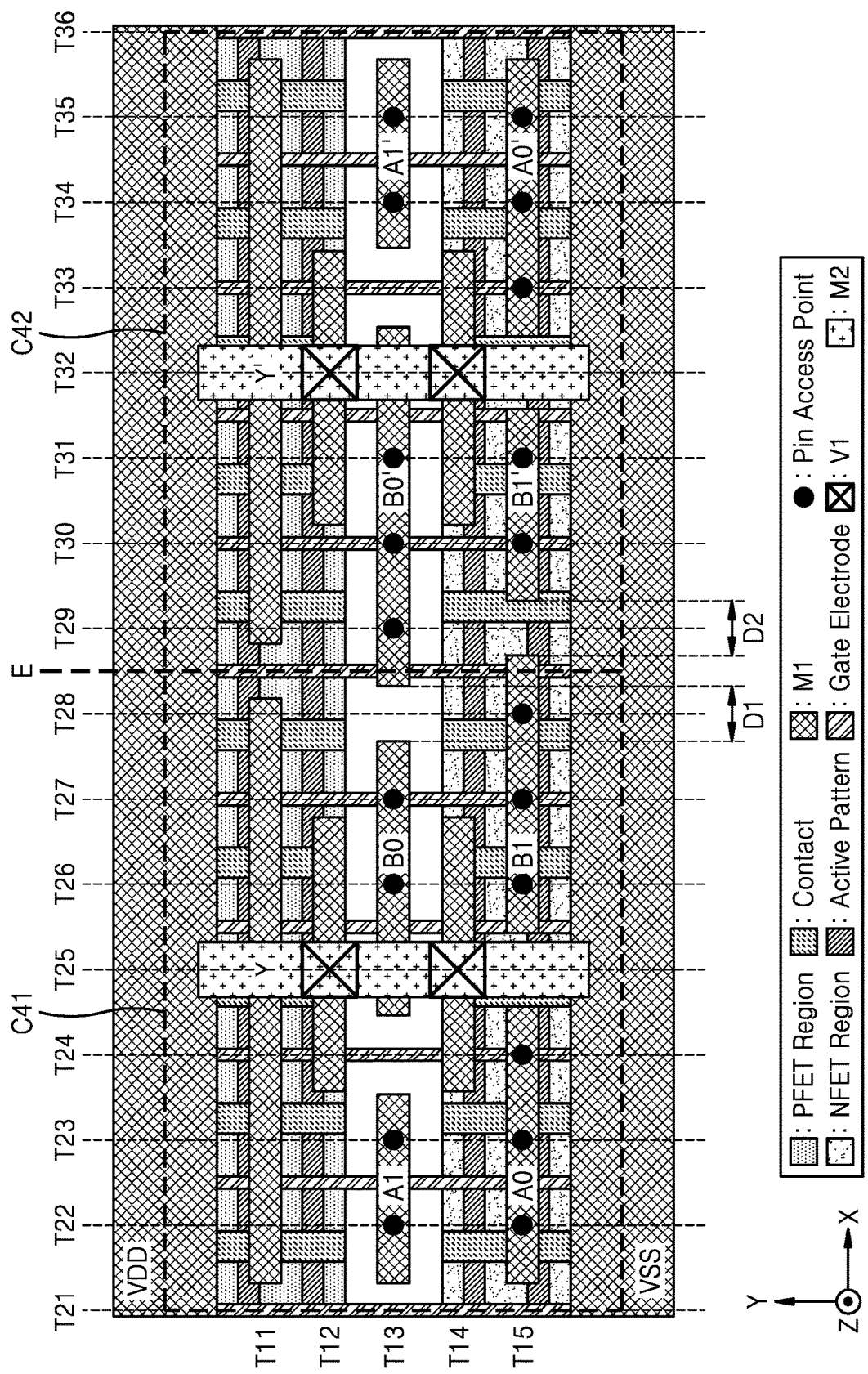
FIGS. 5A and 5B are plan views of examples of the layout of an integrated circuit, according to embodiments.
Figure 5B:
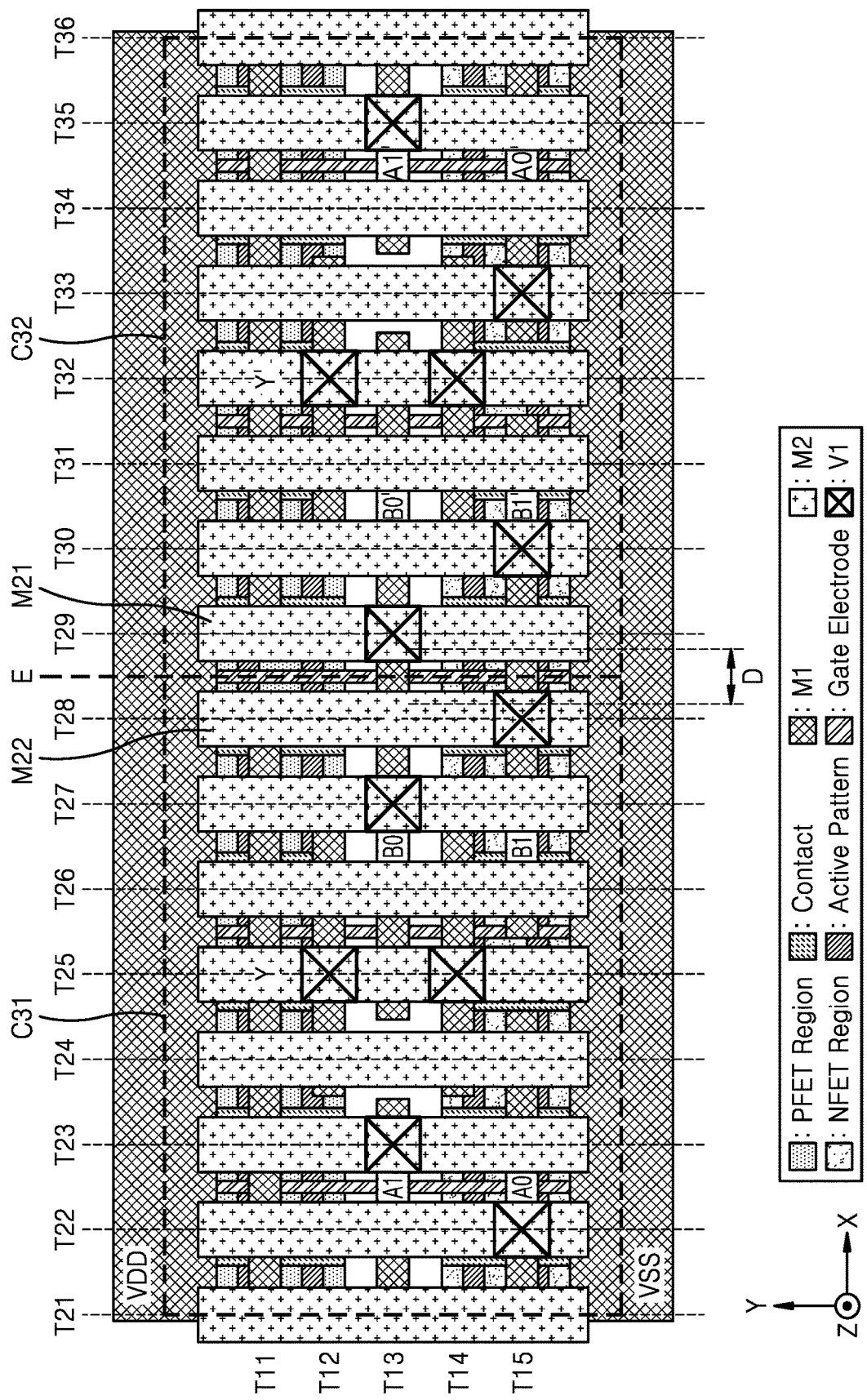

FIGS. 5A and 5B are plan views of examples of the layout of an integrated circuit, according to embodiments. In detail, FIG. 5A is a plan view of a layout including a first AOI22 cell C41 and a second AOI22 cell C42 adjacent to each other, and FIG. 5B is a plan view of a layout in which upper patterns are disposed on the first AOI22 cell C41 and the second AOI22 cell C42 of FIG. 5A. As shown in FIGS. 5A and 5B, lower patterns may extend in the X-axis direction along first to fifth X-tracks T11 to T15 of an M1 layer, and upper patterns may extend in the Y-axis direction along first to sixteenth Y-tracks T21 to T36 of an M2 layer. Hereinafter, descriptions identical to those given above with reference to FIG. 3 will be omitted.

In some embodiments, a pin of a cell may extend, and an extended portion of the pin may have a pin access point. For example, as shown in FIG. 5A, an input pin B0 of the first AOI22 cell C41 may be shortened in the X-axis direction, and thus, the input pin B0 of the first AOI22 cell C41 may be farther apart from a boundary E than the input pin B0 of FIG. 3. An input pin B0' of the second AOI22 cell C42 may extend in the X-axis direction to be a first distance D1 apart from the input pin B0 of the first AOI22 cell C41, and thus, the input pin B0' of the second AOI22 cell C42 may be closer to the boundary E than the input pin B0' of FIG. 3 is. In some embodiments, the first distance D1 may be equal to or greater than the minimum space within the same track of the M1 layer. As a result, the input pin B0 of the first AOI22 cell C41 may be farther apart from the boundary E than the input pin B0' of the second AOI22 cell C42 is. In some embodiments, the input pin B0' of the second AOI22 cell C42 may not intersect with the boundary E unlike as shown in FIG. 5A. Due to extension of the input pin B0' of the second AOI22 cell C42, a point at which the input pin B0' of the second AOI22 cell C42 intersects with the ninth Y-track T29 of the M2 layer may be used as a pin access point. Therefore, the input pin B0' of the second AOI22 cell C42 may have three pin access points, and, unlike in the example shown in FIG. 3, upper patterns extending along the ninth Y-track T29 of the M2 layer in FIG. 5A may be used to route the input pin B0' of the second AOI22 cell C42. Also, despite the length of the input pin B0 of the first AOI22 cell C41 that is less than the length of the input pin B0 of FIG. 3, the input pin B0 of the first AOI22 cell C41 may have two pin access points.

Referring to FIG. 5A, an input pin B1' of the second AOI22 cell C42 may be shortened in the X-axis direction, and thus, the input pin B1' of the second AOI22 cell C42 may be farther apart from the boundary E than the input pin B1' of FIG. 3 is. An input pin B1 of the first AOI22 cell C41 may extend in the X-axis direction to be a second distance D2 apart from the input pin B1' of the second AOI22 cell C42, and thus, the input pin B1 of the first AOI22 cell C41 may be closer to the boundary E than the input pin B1 of FIG. 3 is. In some embodiments, the second distance D2 may be equal to or greater than the minimum space within the same track of the M1 layer. As a result, the input pin B1' of the second AOI22 cell C42 may be farther apart from the boundary E than the input pin B1 of the first AOI22 cell C41 is. In some embodiments, the input pin B1 of the first AOI22 cell C41 may not intersect with the boundary E unlike as shown in FIG. 5A. Due to extension of the input pin B1 of the first AOI22 cell C41, a point at which the input pin B1 of the first AOI22 cell C41 intersects with the eighth Y-track T28 of the M2 layer may be used as a pin access point. Therefore, the input pin B1 of the first AOI22 cell C41 may have three pin access points, and, unlike in the example shown in FIG. 3, upper patterns extending along the eighth Y-track T28 of the M2 layer in FIG. 5A may be used to route the input pin B1 of the first AOI22 cell C41. Also, despite the length of the input pin B1' of the second AOI22 cell C42 that is less than the length of the input pin B1' of FIG. 3, the input pin B1' of the second AOI22 cell C42 may have two pin access points.

Referring to FIG. 5B, upper patterns may extend in the Y-axis direction along the first to sixteenth Y-tracks T21 to T36 of the M2 layer. In some embodiments, at least some of the upper patterns of FIG. 5B may have lengths different from those shown in FIG. 5B. As described above, a point at which the input pin B0' of the second AOI22 cell C42 intersects with the ninth Y-track T29 of the M2 layer may be used as a pin access point, and thus, a via of the V1 layer interconnecting the input pin B0' of the second AOI22 cell C42 and a first upper pattern M21 may be disposed. Also, a point at which the input pin B1 of the first AOI22 cell C41 intersects with the eighth Y-track T28 of the M2 layer may be used as a pin access point, and thus, a via of the V1 layer interconnecting the input pin B1 of the first AOI22 cell C41 and the second upper pattern M22 may be disposed.

Figure 6:
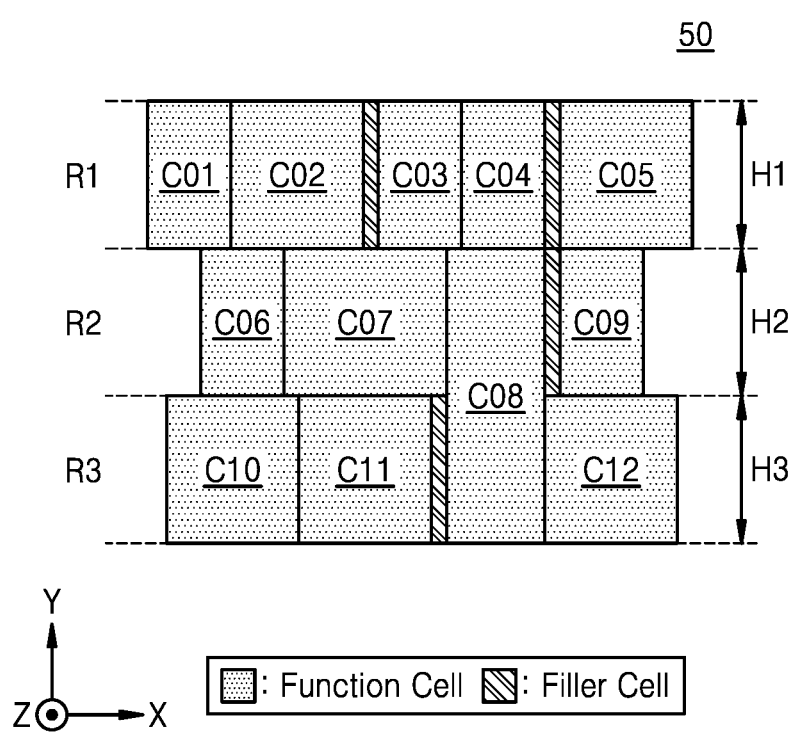
FIG. 6 is a plan view of the layout of an integrated circuit, according to an embodiment.

FIG. 6 is a plan view of the layout of an integrated circuit 50, according to an embodiment. As shown in FIG. 6, the integrated circuit 50 may include a plurality of cells C01 to C12 placed in first to third rows R1 to R3, and may include not only single height cells, but also a multiple-height cell (that is, C08). Power rails may extend in the X-axis direction along boundaries of the first to third rows R1 to R3. The first to third rows R1 to R3 may have first to third heights H1 to H3. In some embodiments, the first to third heights H1 to H3 may be the same, or at least two of the first to third heights H1 to H3 may differ.

In some embodiments, the integrated circuit 50 may include not only a cell that includes pins and performs a pre-defined function (that is, a functional cell), but also a filler cell. As described above with reference to FIG. 3, when cells including a plurality of pins within limited areas, that is, cells with high pin density, are placed adjacent to one another, filler cells may be placed to secure additional pin access points. For example, as shown in FIG. 6, in a first row R1, a filler cell may be inserted between two cells C02 and C03, and a filler cell may be inserted between two cells C04 and C05. Also, in a second row R2, a filler cell may be inserted between two cells C08 and C09, and, in a third row R3, a filler cell may be inserted between two cells C11 and C08. In some embodiments, a filler cell may have a width (i.e., the length in the X-axis direction) corresponding to the first pitch P1 of gate electrodes, that is, a width of 1 CPP.

In some embodiments, a pin of a functional cell adjacent to a filler cell may extend into the filler cell, and an extended portion of the pin may have a pin access point. As described above with reference to FIGS. 1A to 1D, the first pitch P1 between gate electrodes may be different from the second pitch P2 between upper patterns, and thus, as described below with reference to FIGS. 7A and 7B, filler cells may be placed to provide additional pin access points.

Figure 7A:
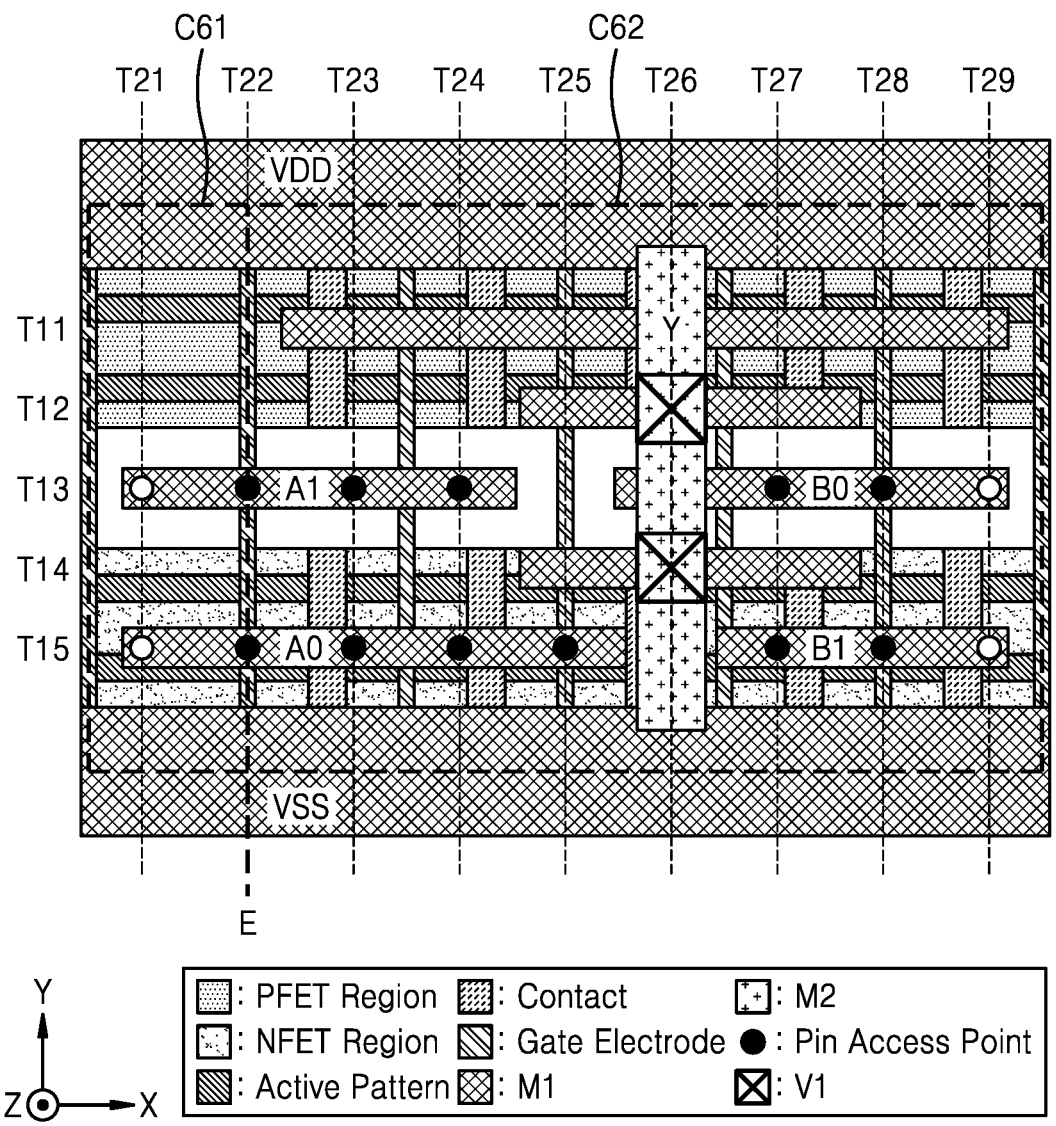
FIGS. 7A to 7C are plan views of examples of a layout of an integrated circuit, according to embodiments.
Figure 7B:
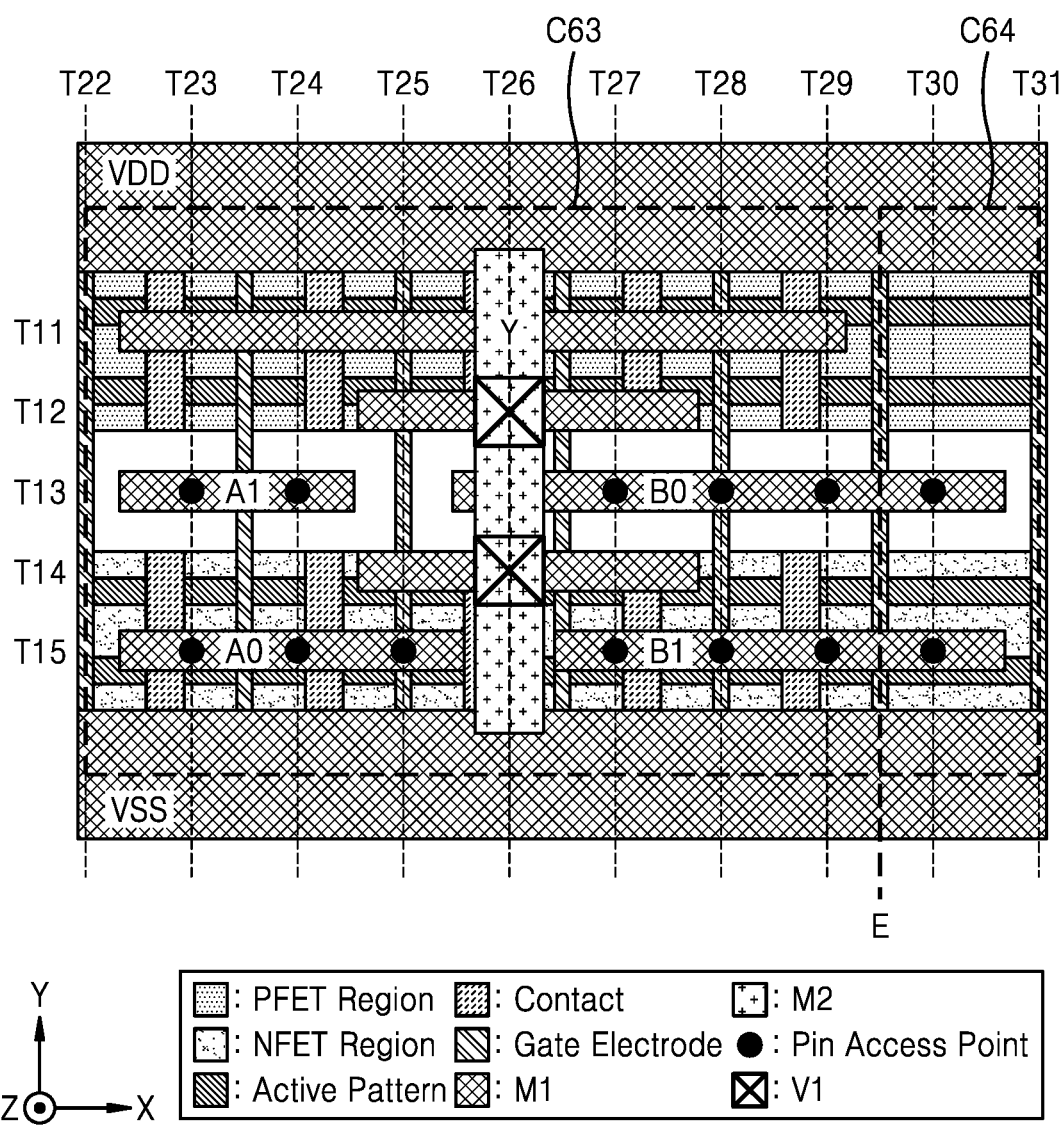
Figure 7C:
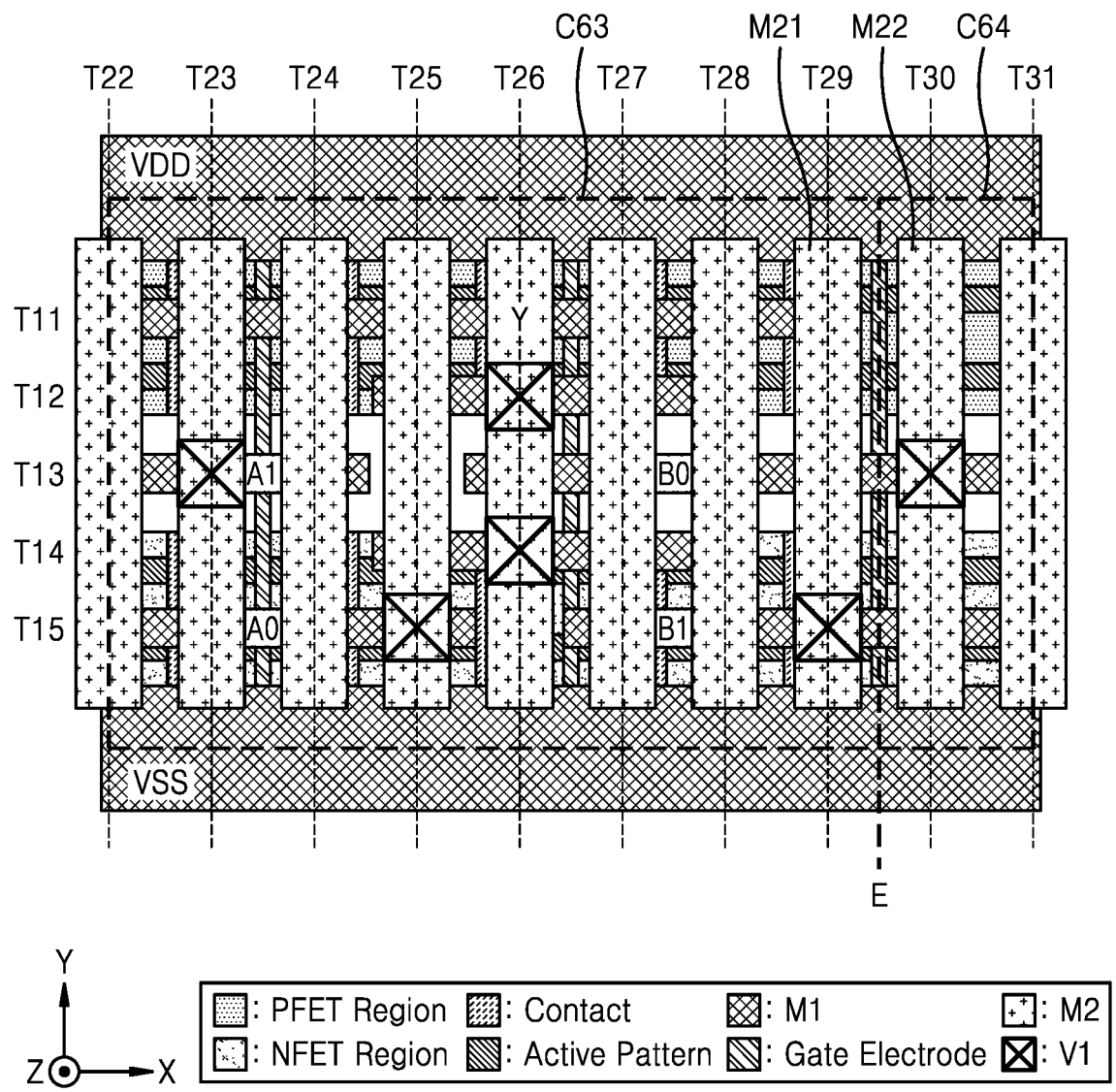

FIGS. 7A to 7C are plan views of examples of a layout of an integrated circuit, according to embodiments. In detail, FIG. 7A is a plan view of a layout including a filler cell C61 and an AOI22 cell C62, FIG. 7B is a plan view of a layout including an AOI22 cell C63 and a filler cell C64, and FIG. 7C is a plan view of a layout in which upper patterns area disposed on the AOI22 cell C63 and the filler cell C64. The AOI22 cell C62 of FIG. 7A and the AOI22 cell C63 of FIG. 7B may each have a structure including pins extended from the first AOI22 cell C31 of FIG. 3. Hereinafter, FIGS. 7A to 7C will be described with reference to FIG. 3.

Referring to FIG. 7A, lower patterns may extend in the X-axis direction along first to fifth X-tracks T11 to T15 of an M1 layer, and upper patterns may extend in the Y-axis direction along first to ninth Y-tracks T21 to T29 of an M2 layer. As shown in FIG. 7A, the filler cell C61 may be located on the left side of the AOI22 cell C62. Input pins A0 and A1 of the AOI22 cell C62 may extend into the filler cell C61 across the boundary E, and thus, as indicated by solid circles • in FIG. 7A, two pin access points may be additionally generated at points at which the extended input pins A0 and A1 intersect with the second X-track T22 of the M2 layer (or a boundary E). However, there may be insufficient via overlaps at points at which the extended input pins A0 and A1 and the first Y-track T21 of the M2 layer intersect with each other. Therefore, as indicated by empty circles ○ in FIG. 7A, points at which the extended input pins A0 and A1 intersect with the first Y-track T21 of the M2 layer may not be usable as pin access points.

Referring to FIG. 7B, lower patterns may extend in the X-axis direction along first to fifth X-tracks T11 to T15 of an M1 layer, and upper patterns may extend in the Y-axis direction along second to eleventh Y-tracks T22 to T31 of an M2 layer. As shown in FIG. 7B, the filler cell C64 may be on the right side of the AOI22 cell C63. Input pins B0 and B1 of the AOI22 cell C63 may extend into the filler cell C64 across a boundary E, and thus, as indicated by solid circles • in FIG. 7B, four pin access points may be additionally generated at points at which the extended input pins B0 and B1 intersect with the ninth Y-track T29 and the tenth Y-track T30 of the M2 layer. Therefore, the AOI22 cell C63 of FIG. 7B may have more pin access points than the AOI22 cell C62 of FIG. 7A, thereby providing higher routing freedom.

Like the filler cell C64 of FIG. 7B, from between two filler cells that may be placed at both sides of a functional cell, a filler cell providing more additional pin access points may be selected during a process of designing an integrated circuit, and the selected filler cell may be disposed at one side of a functional cell. For example, from between two filler cells, a filler cell in which additional pin access points are formed may be disposed adjacent to a functional cell.

Referring to FIG. 7C, upper patterns may extend in the Y-axis direction along the second to eleventh Y-tracks T22 to T31 of the M2 layer. In some embodiments, at least some of the upper patterns of FIG. 7C may have lengths different from those shown in FIG. 7C. As described above, a point at which the input pin B1 of the AOI22 cell C63 intersects with the ninth Y-track T29 of the M2 layer may be used as a pin access point, and thus, a via of a V1 layer interconnecting the input pin B1 of the AOI22 cell C63 and a first upper pattern M21 of the M2 layer may be disposed. Also, a point at which the input pin B0 of the AOI22 cell C63 intersects with the tenth Y-track T30 of the M2 layer may be used as a pin access point, and thus, a via of the V1 layer interconnecting the input pin B0 of the AOI22 cell C63 and the second upper pattern M22 of the M2 layer may be disposed.

Figure 8A:
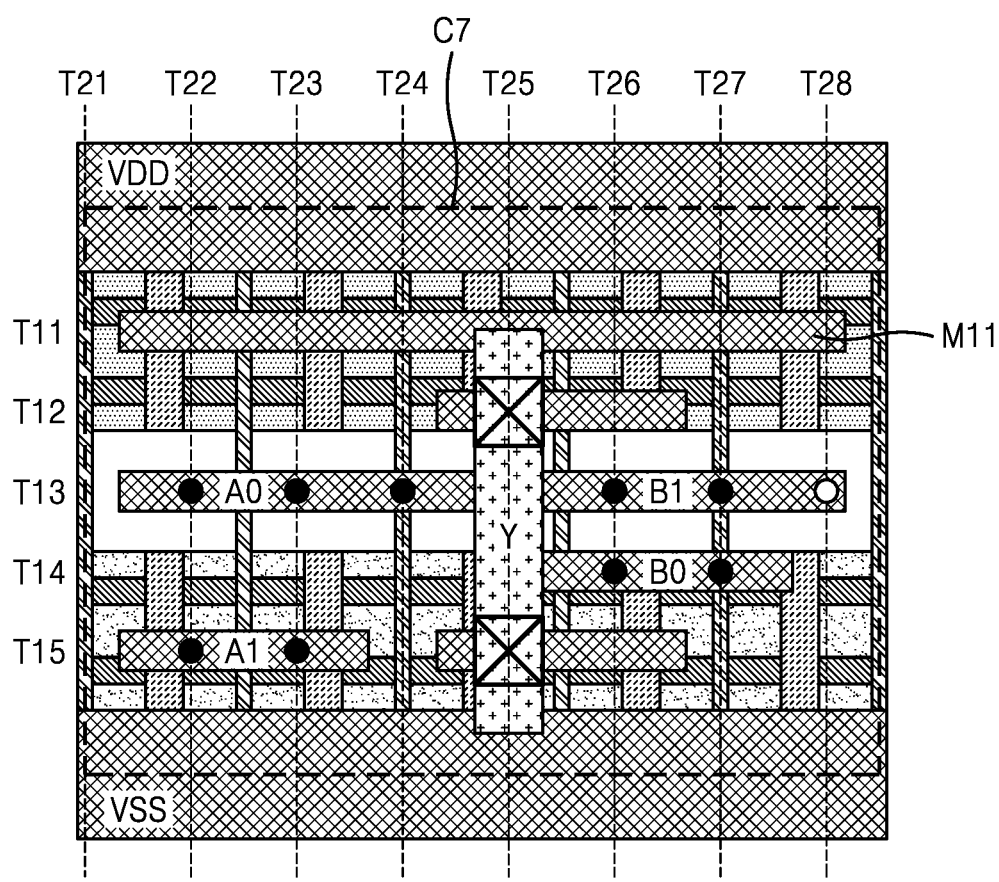
FIGS. 8A and 8B are plan views of examples of the layout of an integrated circuit, according to embodiments.
Figure 8B:
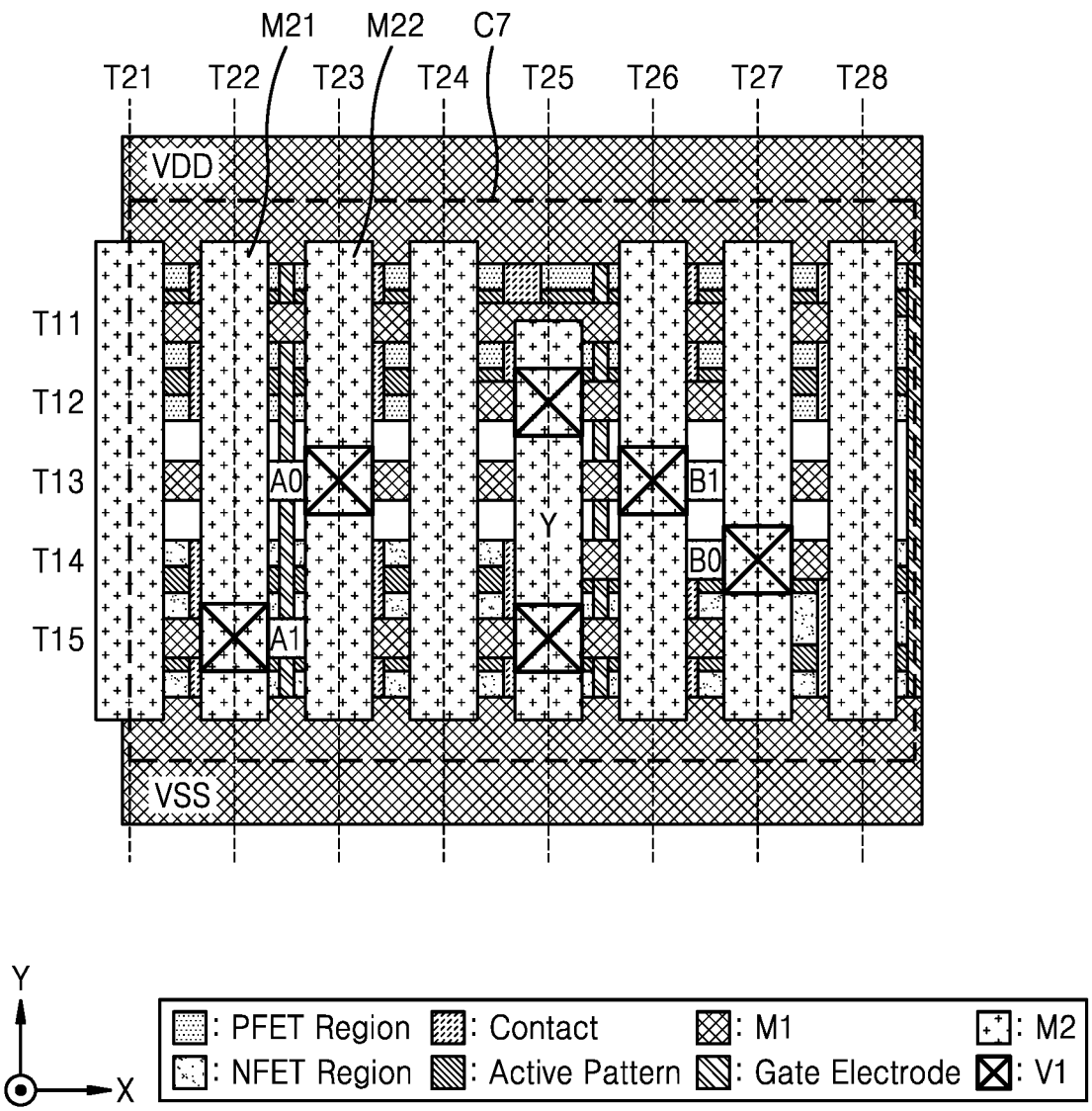

FIGS. 8A and 8B are plan views of examples of a layout of an integrated circuit, according to embodiments. In detail, FIG. 8A is a plan view of a layout including an AOI22 cell C7, and FIG. 8B is a plan view of a layout in which upper patterns are disposed on the AOI22 cell C7 of FIG. 8A. As shown in FIGS. 8A and 8B, lower patterns may extend in the X-axis direction along first to fifth X-tracks T11 to T15 of an M1 layer, and upper patterns may extend in the Y-axis direction along first to eighth Y-tracks T21 to T28 of an M2 layer.

Referring to FIG. 8A, the AOI22 cell C7 may include four input pins A0, A1, B0, and B1 and one output pin Y. As shown in FIG. 8A, an input pin A0 may extend in the X-axis direction along the third X-track T13 of the M1 layer and may have three pin access points. An input pin B1 may extend in the X-axis direction along the third X-track T13 of the M1 layer and may have two pin access points. An input pin B0 may extend in the X-axis direction along the fourth X-track T14 of the M1 layer and may have two pin access points. An input pin A1 may extend in the X-axis direction along the fifth X-track T15 of the M1 layer and may have two pin access points. Also, the output pin Y may extend in the Y-axis direction along the fifth Y-track T25 of the M2 layer. A first lower pattern M11 for internal signals different from input signals input through the input pins A0, A1, B0 and B1 and an output signal output through the output pin Y of the AOI22 cell C7 may extend in the X-axis direction along the first X-track T11 of the M1 layer.

Referring to FIG. 8B, upper patterns may extend in the Y-axis direction along the first to eighth Y-tracks T21 to T28 of the M2 layer. In some embodiments, at least some of the upper patterns of FIG. 8B may have lengths different from those shown in FIG. 8B. As shown in FIG. 8B, vias may be disposed at some of the pin access points of FIG. 8A, and pins may be connected to the upper patterns through the vias. For example, the input pin A1 may be connected to the first upper pattern M21 through a via disposed at a point at which the input pin A1 intersects with the second Y-track T22 of the M2 layer, and the input pin A0 may be connected to the second upper pattern M22 through a via disposed at a point at which the input pin A0 intersects with the third Y-track T23 of the M2 layer.

When pin access points are densely disposed at tracks adjacent to one another in the M1 layer (e.g., the third to fifth X-tracks T13 to T15 of the M1 layer) as shown in FIG. 8A, a via may be disposed at only one pin access point of pin access points intersecting with one Y-track of the M2 layer. On the other hand, as described below with reference to FIGS. 9A and 9B, when pin access points are scattered at tracks apart from one another, vias may be disposed at two or more pin access points of pin access points intersecting with one Y-track of the M2 layer.

Figure 9A:
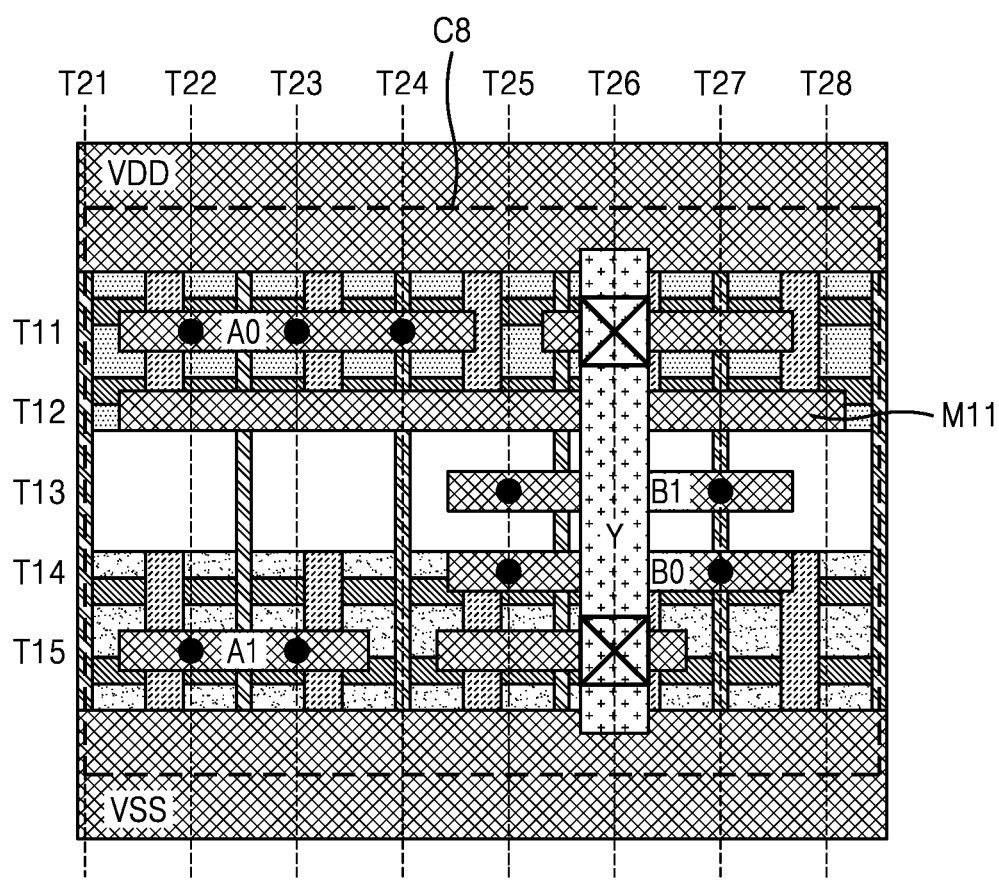
FIGS. 9A and 9B are plan views of examples of the layout of an integrated circuit, according to embodiments.
Figure 9B:
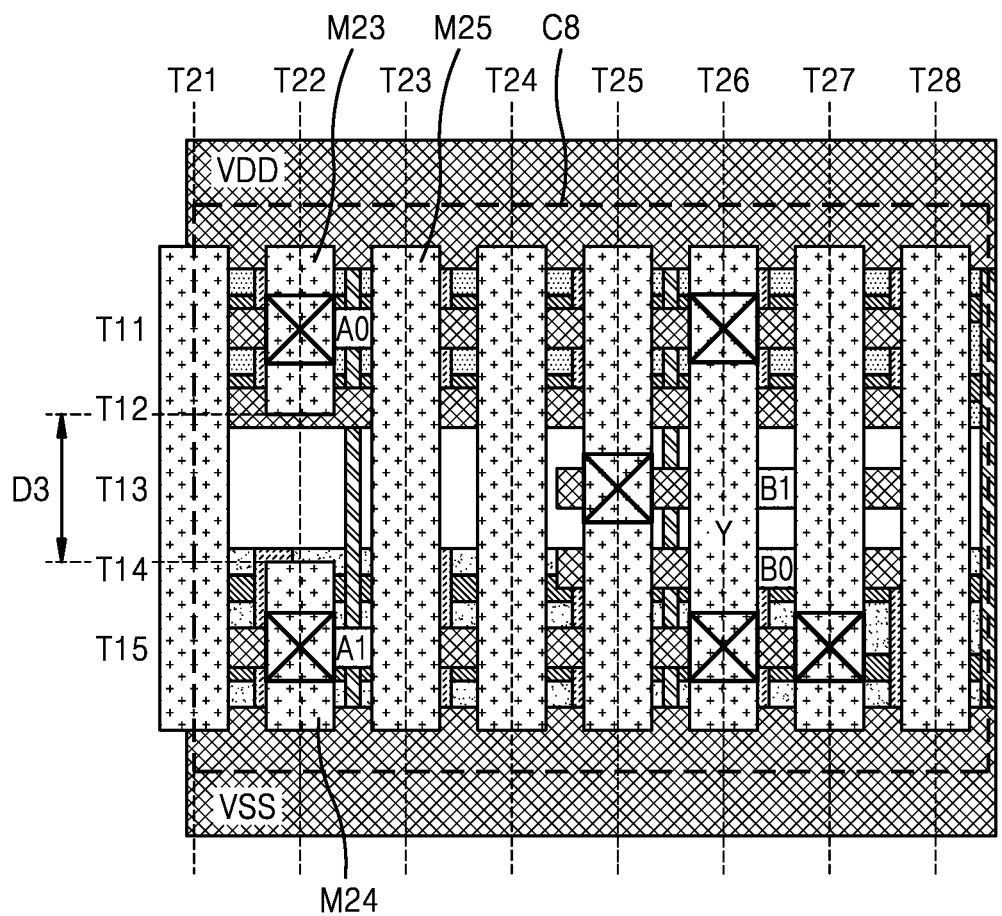
Figure 9B:
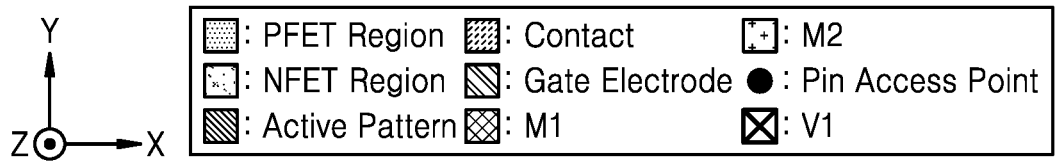

FIGS. 9A and 9B are plan views of examples of a layout of an integrated circuit, according to embodiments. In detail, FIG. 9A is a plan view of a layout including an AOI22 cell C8, and FIG. 9B is a plan view of a layout in which upper patterns are disposed on the AOI22 cell C8 of FIG. 9A. As shown in FIGS. 9A and 9B, lower patterns may extend in the X-axis direction along first to fifth X-tracks T11 to T15 of an M1 layer, and upper patterns may extend in the Y-axis direction along first to eighth Y-tracks T21 to T28 of an M2 layer.

Referring to FIG. 9A, the AOI22 cell C8 may include four input pins A0, A1, B0, and B1 and one output pin Y. As shown in FIG. 9A, the input pin A0 may extend in the X-axis direction along the first X-track T11 of the M1 layer and may have three pin access points. The input pin B1 may extend in the X-axis direction along the third X-track T13 of the M1 layer and may have two pin access points. The input pin B0 may extend in the X-axis direction along the fourth X-track T14 of the M1 layer and may have two pin access points.

The input pin A1 may extend in the X-axis direction along the fifth X-track T15 of the M1 layer and may have two pin access points.

In the AOI22 cell C8 of FIG. 9A, a first lower pattern M11 for an internal signal may extend in the X-axis direction along the second X-track T12 of the M1 layer, and the input pin A0 may extend in the X-axis direction along the first X-track T11 of the M1 layer. Therefore, the input pins A0 and A1 having pin access points at points at which the input pins A0 and A1 intersect with the second Y-track T22 and the third Y-track T23 of the M2 layer may be farther apart each other in the Y-axis direction than the input pins A0 and A1 of FIG. 8A.

Referring to FIG. 9B, upper patterns may extend in the Y-axis direction along the first to eighth Y-tracks T21 to T28 of the M2 layer. In some embodiments, at least some of the upper patterns of FIG. 9B may have lengths different from those shown in FIG. 9B. As shown in FIG. 9B, vias may be disposed at some of the pin access points of FIG. 9A, and pins may be connected to upper patterns through the vias. For example, the input pin A0 may be connected to a third upper pattern M23 through a via disposed at a point at which the input pin A0 intersects with the second Y-track T22 of the M2 layer, and the input pin A1 may be connected to the fourth upper pattern M24 through a via disposed at a point at which the input pin A1 intersects with the second Y-track T22 of the M2 layer. The third upper pattern M23 and the fourth upper pattern M24 on the same track of the M2 layer (that is, the second Y-track T22) may be apart from each other in the Y-axis direction by a third distance D3 which may be equal to or greater than the minimum space within the same track of the M2 layer. In some embodiments, the third upper pattern M23 and the fourth upper pattern M24 may be formed by splitting one upper pattern extending along the second Y-track T22 of the M2 layer through an M2 cut, and the third upper pattern M23 and the fourth upper pattern M24 may be apart from each other by the minimum space within the same track of the M2 layer.

As shown in FIG. 9B, vias for two input pins A0 and A1 may be disposed on the second Y-track T22 of the M2 layer, and thus, an upper pattern extending along another track of the M2 layer may be used for routing another signal. For example, the second upper pattern M22 extending along the second Y-track T23 of the M2 layer in FIG. 8B may be used for routing the input pin A0 of the AOI22 cell C7, and a fifth upper pattern M25 extending along the third Y-track T23 of the M2 layer in FIG. 9B may be independently used for routing signals for the AOI22 cell C8. Therefore, routing freedom may be improved, and routing congestion may be reduced.

Figure 10:
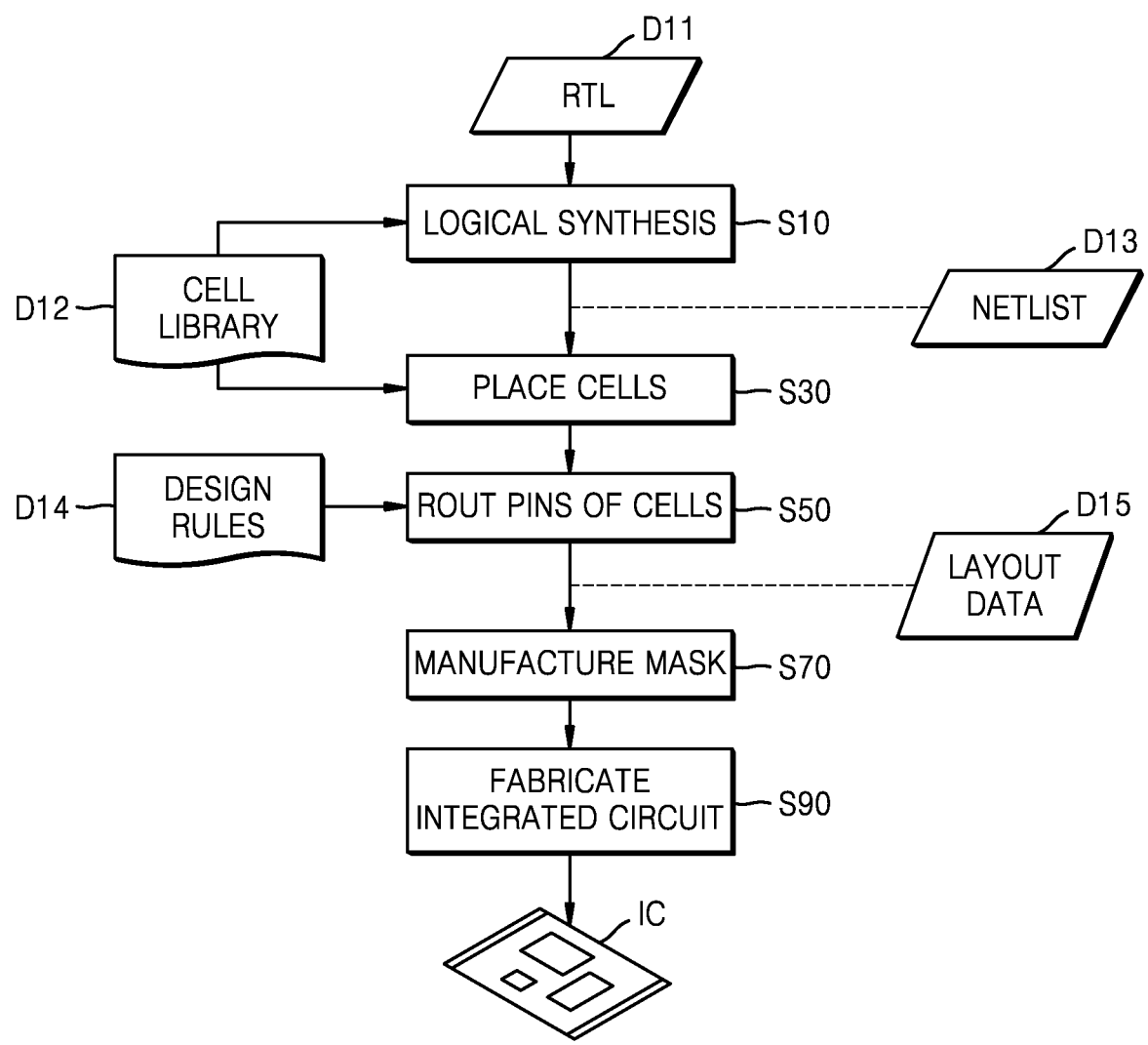
FIG. 10 is a flowchart of a method of fabricating an integrated circuit, according to an embodiment.

FIG. 10 is a flowchart of a method of manufacturing an integrated circuit (IC), according to an embodiment. In detail, FIG. 10 is a flowchart showing an example of a method of manufacturing the integrated circuit IC providing increased pin access points. As shown in FIG. 10, the method of manufacturing the integrated circuit IC may include a plurality of operations S10, S30, S50, S70, and S90.

A cell library (or a standard cell library) D12 may include information regarding cells, e.g., function information, characteristic information, layout information, etc. In some embodiments, the cell library D12 may define cells including pins extending along the outermost tracks of tracks of a lower layer, as described above with reference to FIG. 9A. In some embodiments, the cell library D12 may define cells including lower patterns having shortened lengths, as described later with reference to FIG. 12. Design rules D14 may include conditions that the layout of the integrated circuit IC need to comply with. For example, the design rules D14 may include requirements regarding spaces between patterns, the minimum width of the patterns, a routing direction of a wiring layer, etc. In some embodiments, the design rules D14 may define the minimum space within the same track of a wiring layer.

In operation S10, a logical synthesis operation for generating a netlist D13 from register-transfer level (RTL) data D11 may be performed. For example, a semiconductor design tool (e.g., a logical synthesis tool) may perform a logical synthesis with reference to the cell library D12 from the RTL data D11 composed in the Very High Speed Integration Circuit (VHSIC) Hardware Description Language (VHDL) and Verilog, thereby generating a netlist D13 including a bitstream or a netlist. The netlist D13 may correspond to an input of place and route described below and may be referred to as input data herein.

In operation S30, cells may be placed. For example, a semiconductor design tool (e.g., a place and route tool) may place cells used in the netlist D13 with reference to the cell library D12. In some embodiments, the semiconductor design tool may place not only cells used in the netlist D13, but also additional cells (e.g., filler cells). An example of operation S30 is described below with reference to FIG. 15.

In operation S50, pins of cells may be routed. For example, the semiconductor design tool may generate interconnections electrically connecting output pins and input pins of placed cells and generate layout data D15 defining the placed cells and the interconnections. An interconnection may include a via of a via layer and/or a pattern of a wiring layer. The layout data D15 may have a format like Graphic Data System II (GDSII) and may include geometric information regarding cells and interconnections. The semiconductor design tool may refer to the design rules D14 while routing pins of cells. The layout data D15 may correspond to an output of the place and routing and may be referred to as output data herein. Operation S50 may alone be or operation S30 and operation S50 may collectively be referred to as a method of designing an IC, and an example of operation S50 will be described below with reference to FIGS. 11 to 15.

In operation S70, an operation for manufacturing a mask may be performed. For example, optical proximity correction (OPC) for correcting distortion due to characteristics of light (e.g., refraction) in photolithography may be applied to the layout data D15. Patterns on the mask may be defined to form patterns to be disposed in a plurality of layers based on OPC-applied data, and at least one mask (or photomask) for forming patterns of each of the layers may be manufactured. In some embodiments, the layout of the IC may be limitedly modified in operation S70, and the limited modification of the IC in operation S70 may be a post-processing for optimizing the structure of the IC and may be referred to as design polishing.

In operation S90, an operation for manufacturing the integrated circuit IC may be performed. For example, the integrated circuit IC may be manufactured by patterning the plurality of layers by using the at least one mask manufactured in operation S70. For example, a front-end-of-line (FEOL) may include planarizing and cleaning a wafer, forming a trench, forming a well, forming a gate electrode, and forming a source and a drain, and individual devices like a transistor, a capacitor, and a resistor may be formed on a substrate through the FEOL. Also, for example, a back-end-of-line (BEOL) may include operations like silicidation of a gate, a source region, and a drain region, adding a dielectric, planarizing, forming holes, adding metal layers, forming vias, and forming a passivation layer, and individual devices like a transistor, a capacitor, and a resistor may be connected to one another through the BEOL. In some embodiments, a middle-of line (MOL) may be formed between the FEOL and the BEOL, and contacts may be formed on individual elements. Next, the IC may be packaged in a semiconductor package and used as a component for various applications.

Figure 11:
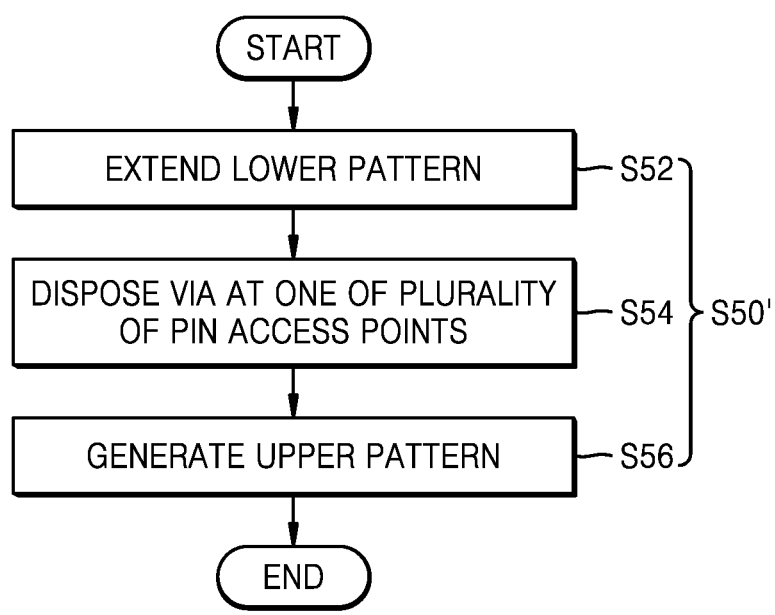
FIG. 11 is a flowchart of a method of designing an integrated circuit, according to an embodiment.

FIG. 11 is a flowchart of a method of designing an integrated circuit, according to an embodiment. In detail, the flowchart of FIG. 11 shows an example of operation S50 of FIG. 10. As described above with reference to FIG. 10, pins of cells may be routed in operation S50' of FIG. 11. As shown in FIG. 11, operation S50' may include a plurality of operations S52, S54, and S56.

Referring to FIG. 11, a lower pattern may be extended in operation S52. In some embodiments, as described above with reference to FIGS. 5A, 7A, and 7B, a pin of a cell may extend in the X-axis direction to be close to a boundary with respect to an adjacent cell. In some embodiments, a pin may extend to be at least the minimum space according to design rules apart from a lower pattern of an adjacent cell extending at the same track. In some embodiments, a pin may extend into an adjacent cell and intersect with a boundary between cells. An example of operation S52 is described below with reference to FIG. 13.

In operation S54, a via may be disposed at one of a plurality of pin access points. Pins included in a cell may each have at least one pin access point. Also, the pin extended in operation S52 may have at least one additional pin access point at an extended portion. Therefore, a via may be disposed at one of a plurality of pin access points including the additional pin access point at the extended portion. Next, in operation S56, an upper pattern may be generated. For example, an upper pattern connected to the via disposed in operation S54 and extending in the Y-axis direction may be generated.

Figure 12:
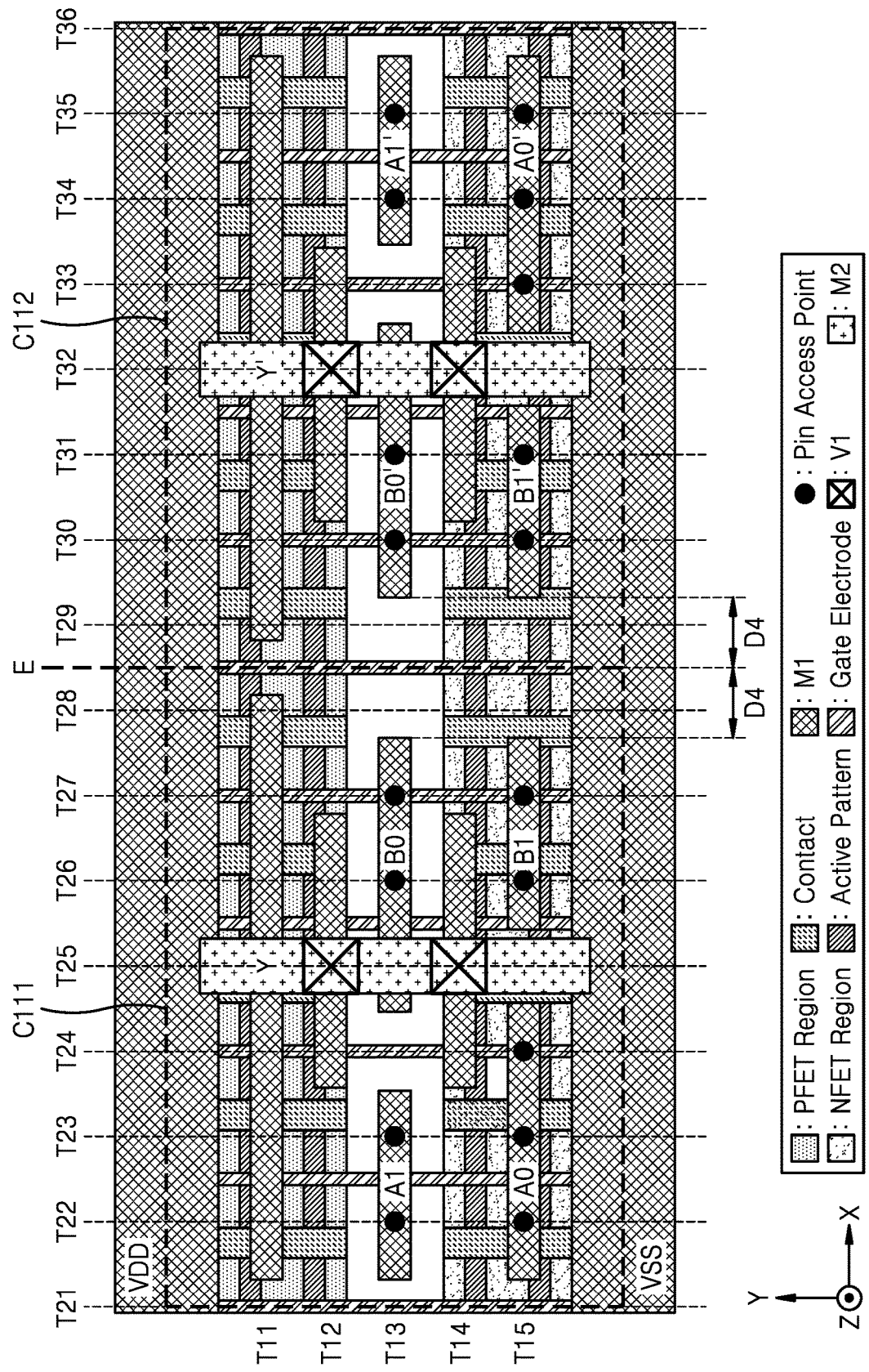
FIG. 12 is a plan view of the layout of an integrated circuit, according to an embodiment.

FIG. 12 is a plan view of the layout of an integrated circuit, according to an embodiment. In detail, FIG. 12 is a plan view of a layout including first and second AOI22 cells C111 and C112 adjacent to each other. As shown in FIG. 12, the first and second AOI22 cells C111 and C112 may be placed adjacent to each other in the same row. As shown in FIG. 12, lower patterns may extend in the X-axis direction along first to fifth X-tracks T11 to T15 of an M1 layer, and upper patterns may extend in the Y-axis direction along first to sixteenth Y-tracks T21 to T36 of an M2 layer.

The first and second AOI22 cells C111 and C112 may include shortened pins. For example, a first AOI22 cell C111 may include an input pin B0 shorter than the input pin B0 of FIG. 3, and two pin access points may be maintained at the input pin B0 of FIG. 12. Also, the second AOI22 cell C112 may include an input pin B0' shorter than the input pin B0' of FIG. 3, and two pin access points may be maintained at the input pin B0' of FIG. 12. Therefore, the input pin B0 may be apart from a boundary E by a fourth distance D4, and the input pin B0' may also be apart from the boundary E by the fourth distance D4.

As described above with reference to FIG. 11, pins may be extended to secure additional pin access points, and a cell may include pins shortened not to interfere with extension of pins of an adjacent cell. For example, in operation S30 of FIG. 10, as shown in FIG. 12, the first and second AOI22 cells C111 and C112 may be placed, and the first and second AOI22 cells C111 and C112 may be modified like the first and second AOI22 cells C41 and C42 of FIG. 5A as at least one of the input pins B0' and B1 of FIG. 12 is extended in operation S52 of FIG. 11.

Figure 13:
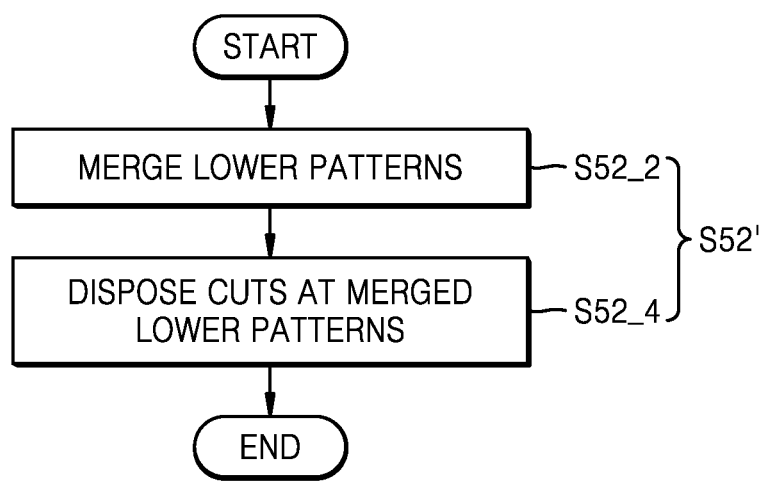
FIG. 13 is a flowchart of a method of designing an integrated circuit, according to an embodiment.

FIG. 13 is a flowchart of a method of designing an integrated circuit, according to an embodiment. In detail, FIG. 13 is a flowchart showing an example of operation S52 of FIG. 11. As described above with reference to FIG. 11, lower patterns may be extended in operation S52' of FIG. 13. As shown in FIG. 13, operation S52' may include operation S52_2 and operation S52_4.

Referring to FIG. 13, in operation S52_2, the lower patterns may be merged. For example, lower patterns, which are respectively included in cells placed adjacent to one another and extend on the same track, may be merged by being extended.

In operation S52_4, a cut may be disposed at merged lower patterns. The cut may separate the merged lower patterns, and lower patterns separated by the cut may be apart from one another by the minimum space within the same track of a lower wiring layer, that is, the M1 layer.

Figure 14A:
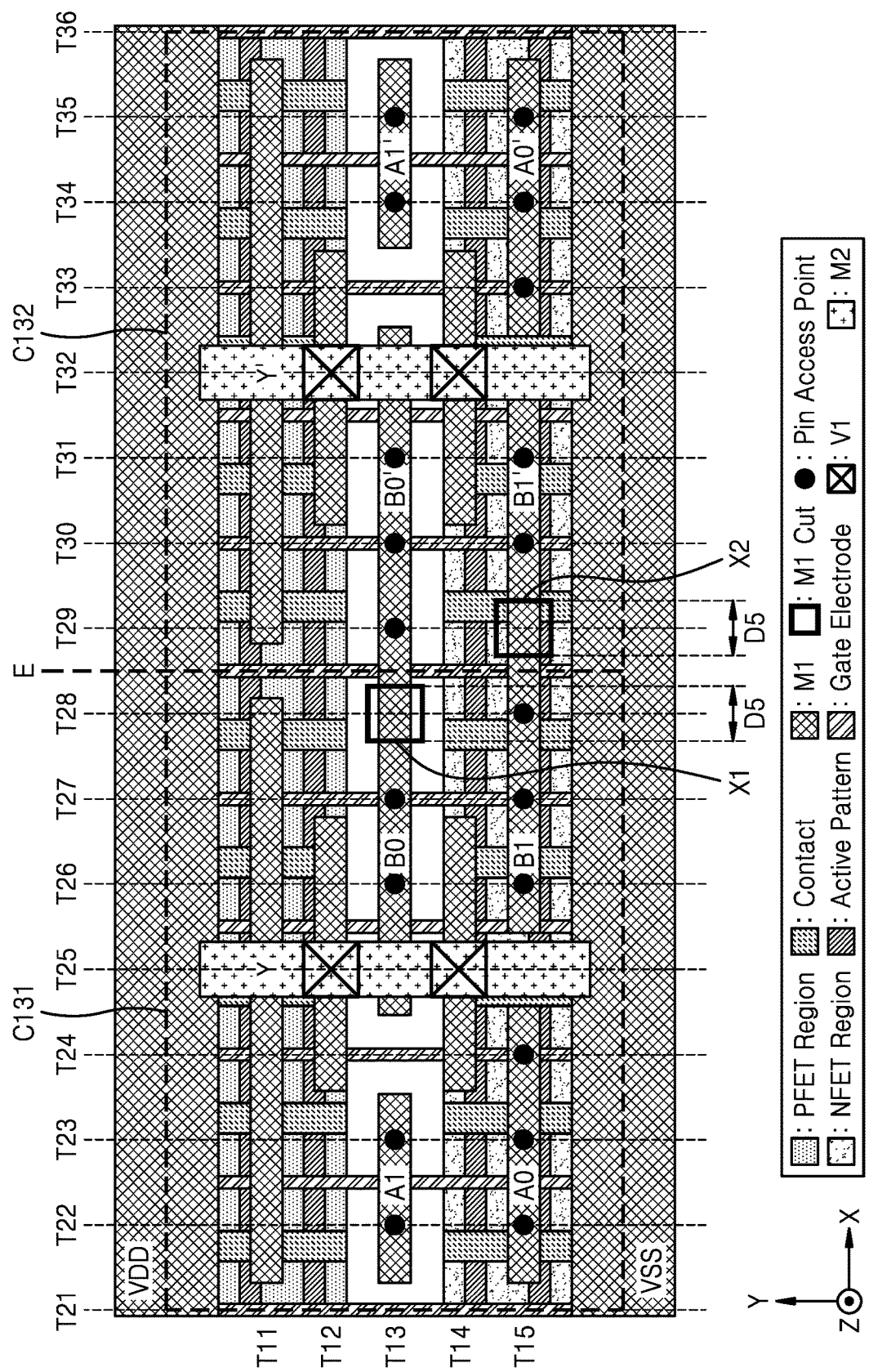
FIGS. 14A and 14B are plan views of examples of layouts of an integrated circuit, according to embodiments.
Figure 14B:
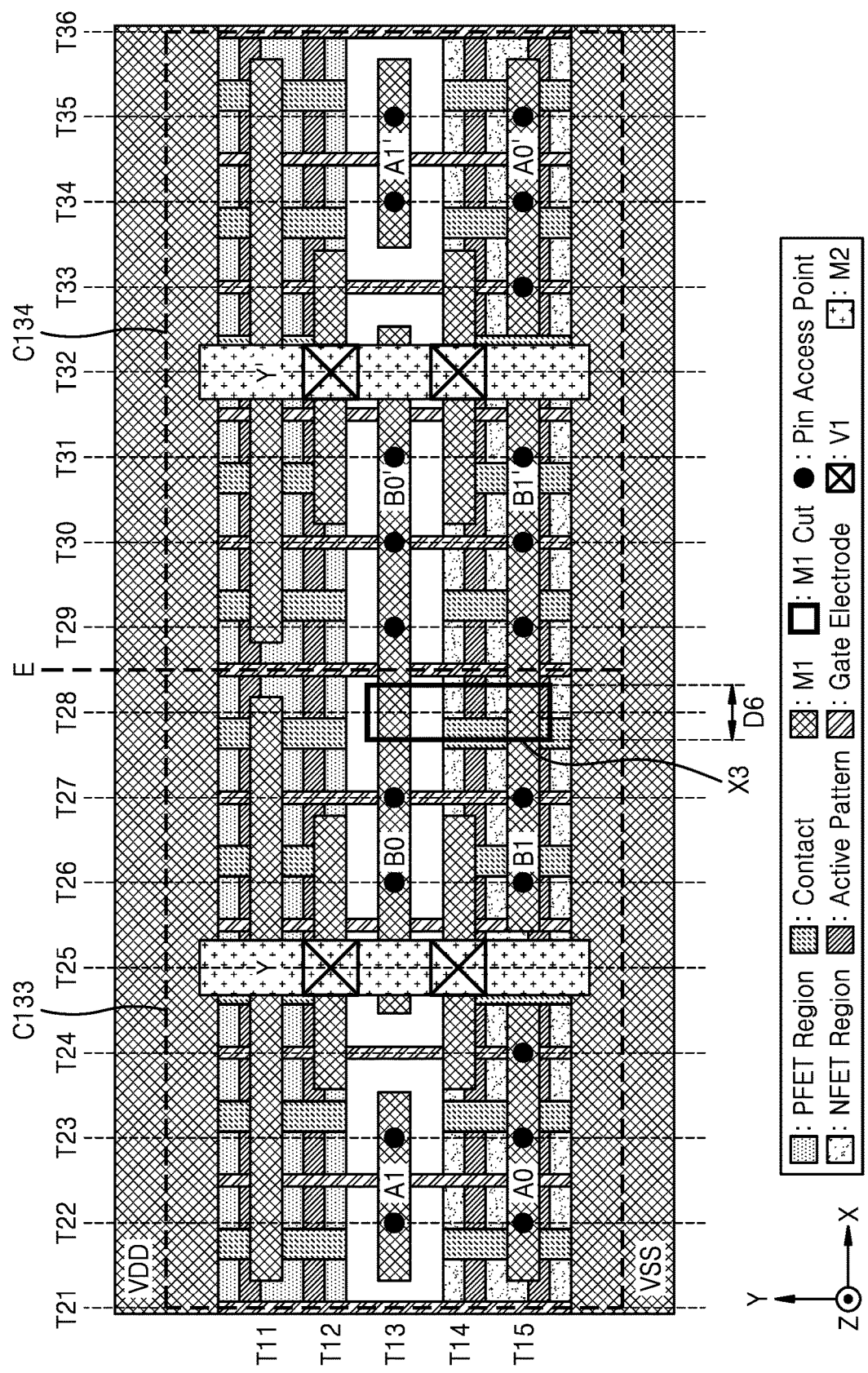

FIGS. 14A and 14B are plan views of examples of layouts of an integrated circuit, according to embodiments. In detail, the plan view of FIG. 14A shows that operation S52' of FIG. 13 is performed at first and second AOI22 cells C131 and C132 adjacent to each other, and the plan view of FIG. 14B shows that operation S52' of FIG. 13 is performed at first and second AOI22 cells C133 and C134 adjacent to each other. Hereinafter, descriptions of FIGS. 14A and 14B that are identical to each other will be omitted.

Referring to FIG. 14A, the first and second AOI22 cells C131 and C132 may be placed adjacent to each other in the same row. As shown in FIG. 14A, lower patterns may extend in the X-axis direction along first to fifth X-tracks T11 to T15 of an M1 layer, and upper patterns may extend in the Y-axis direction along first to sixteenth Y-tracks T21 to T36 of an M2 layer.

After the first and second AOI22 cells C131 and C132 are placed, a semiconductor design tool may merge lower patterns of the first and second AOI22 cells C131 and C132 by extending the lower patterns. For example, as shown in FIG. 14A, an input pin B0 of the first AOI22 cell C131 and/or an input pin B0' of the second AOI22 cell C132 may be extended, and thus, the input pin B0 of the first AOI22 cell C131 and the input pin B0' of the second AOI22 cell C132 may be merged. Also, an input pin B1 of the first AOI22 cell C131 and/or an input pin B1' of the second AOI22 cell C132 may be extended, and thus, the input pin B1 of the first AOI22 cell C131 and the input pin B1' of the second AOI22 cell C132 may be merged.

In some embodiments, a cut of a lower wiring layer may be made at a merged lower pattern. For example, as shown in FIG. 14A, a first cut X1 may be at a lower pattern in which the input pin B0 of the first AOI22 cell C131 and the input pin B0' of the second AOI22 cell C132 are merged, and a second cut X2 may be at a lower pattern in which the input pin B1 of the first AOI22 cell C131 and the input pin B1' of the second AOI22 cell C132 are merged. In some embodiments, cuts may not be aligned with a boundary E. For example, as shown in FIG. 14A, the first cut X1 may be where the center point thereof is on the left side of the boundary E. Therefore, the input pin B0' of the second AOI22 cell C132 may have an additional pin access point at a point at which the input pin B0' intersects with the ninth Y-track T29 of the M2 layer. Also, the second cut X2 may be where the center point thereof is on the right side of the boundary E. Therefore, the input pin B1 of the first AOI22 cell C131 may have an additional pin access point at a point at which the input pin B1 intersects with the eighth Y-track T28 of the M2 layer. As shown in FIG. 14A, lower patterns separated by the first cut X1 and the second cut X2 may be a fifth distance D5 apart from each other, wherein the fifth distance D5 may correspond to the minimum space within the same track of the M1 layer.

Referring to FIG. 14B, the first and second AOI22 cells C133 and C134 may be placed adjacent to each other in the same row. In some embodiments, cuts of a lower wiring layer may be made at two or more merged lower patterns. For example, as shown in FIG. 14B, a third cut X3 may be at a lower pattern in which an input pin B0 of the first AOI22 cell C133 is merged with an input pin B0' of the second AOI22 cell C134 and a lower pattern in which an input pin B1 of the first AOI22 cell C133 is merged with an input pin B1' of the second AOI22 cell C134. As shown in FIG. 14B, the third cut X3 may extend in the Y-axis direction and separate lower patterns extending at the third X-track T13 and the fifth X-track T15 of an M1 layer. As shown in FIG. 14B, the lower patterns separated by the third cut X3 may be a sixth distance D6 apart from each other, and, in some embodiments, the sixth distance D6 may be same with the fifth distance D5 of FIG. 14A. In some embodiments, when it is easy to route input pins B0 and B1 of the first AOI22 cell C133 and it is not easy to route input pins B0' and B1' of the second AOI22 cell C134, the semiconductor design tool may increase pin access points of the input pins B0' and B1' of the second AOI22 cell C134 through the third cut X3 as shown in FIG. 14B.

Figure 15:
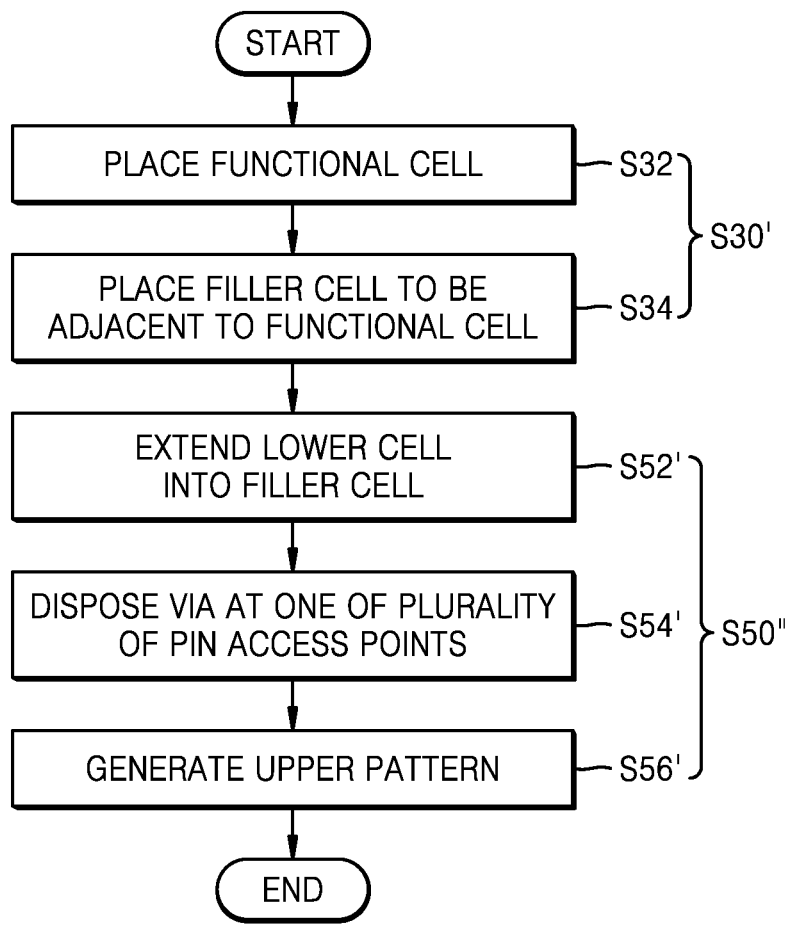
FIG. 15 is a flowchart of a method of designing an integrated circuit, according to an embodiment.

FIG. 15 is a flowchart of a method of designing an integrated circuit, according to an embodiment. In detail, the flowchart of FIG. 15 shows an example of operation S30 and operation S50 of FIG. 10. As described above with reference to FIG. 10, cells may be placed in operation S30' of FIG. 15, and pins of the cells may be routed in operation S50" of FIG. 15. As shown in FIG. 15, operation S30' may include operation S32 and operation S34, and operation S50" may include operation S52', operation S54', and operation S56'.

Referring to FIG. 15, in operation S32, functional cells may be placed. The functional cells may refer to cells used by the netlist D13 of FIG. 10. The semiconductor design tool may place single height cells in one of a series of rows and place multiple-height cells in two or more successive rows.

In operation S34, a filler cell may be placed close to the functional cells. As described above with reference to FIG. 6, a filler cell may be interposed between functional cells to rout pins of the functional cells. As described above with reference to FIGS. 7A to 7C, a filler cell that is more appropriate for routing between filler cells that can be placed on both sides of a functional cell may be placed. An example of operation S34 is described below with reference to FIG. 16.

In operation S52', a lower pattern may extend into the filler cell. For example, the semiconductor design tool may extend at least one pin of a functional cell into the filler cell, and an extended pin may pass through the boundary between the functional cell and the filler cell.

In operation S54', a via may be disposed at one of a plurality of pin access points. Pins included in a cell may each have at least one pin access point. Also, the pin extended in operation S52' may have at least one additional pin access point at an extended portion. Therefore, a via may be disposed at one of a plurality of pin access points including the additional pin access point at the extended portion. Next, in operation S56', an upper pattern may be generated. For example, an upper pattern connected to the via disposed in operation S54 may be generated.

Figure 16:
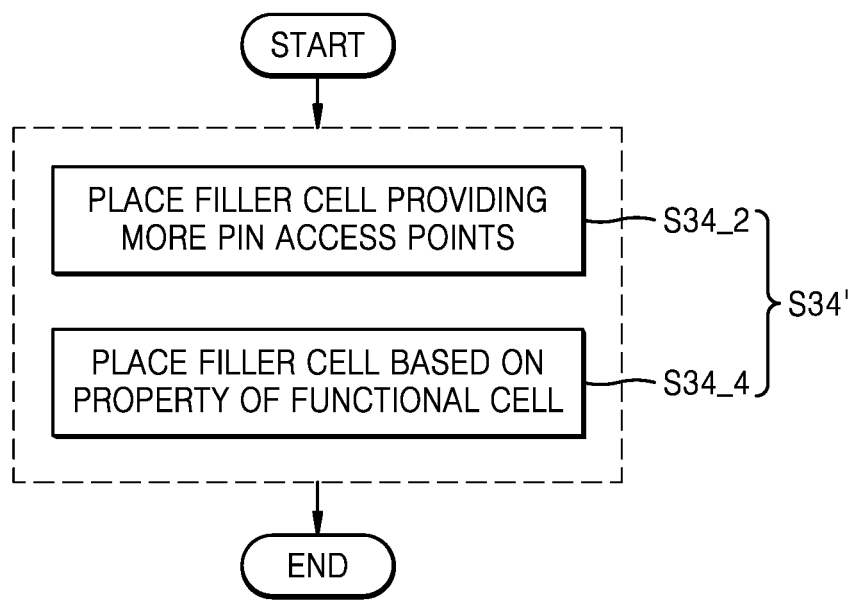
FIG. 16 is a flowchart of a method of designing an integrated circuit, according to an embodiment.

FIG. 16 is a flowchart of a method of designing an integrated circuit, according to an embodiment. In detail, FIG. 16 is a flowchart showing an example of operation S34 of FIG. 15. As described above with reference to 15, in operation S34' of FIG. 16, a filler cell may be placed adjacent to a functional cell. As shown in FIG. 16, operation S34' may include operation S34_2 and operation S34_4. In some embodiments, operation S34' may include either operation S34_2 or operation S34_4 only.

Referring to FIG. 16, in operation S34_2, a filler cell providing more pin access points may be placed. For example, as described above with reference to FIGS. 7A to 7C, two filler cells that may be placed on both sides of a functional cell may provide different numbers of additional pin access points. The semiconductor design tool may determine a filler cell providing more pin access points from between the two filler cells and place a determined filler cell to be adjacent to a functional cell. In some embodiments, the semiconductor design tool may determine and dispose a filler cell that provides additional pin access points.

In operation S34_4, a filler cell may be placed based on a property of a functional cell. For example, as described above with reference to FIGS. 7A to 7C, a filler cell providing more pin access points may be determined according to a relative location between a functional cell (or gate electrodes included in the functional cell) and tracks of an upper wiring layer, and thus a condition for a filler cell providing more pin access points may be defined in advance. For example, as shown in FIGS. 7A and 7B, a filler cell disposed adjacent to a boundary, which does not intersect with a track of an upper wiring layer, from between both boundaries of a functional cell may be more appropriate, and the semiconductor design tool may place a filler cell with reference to a pre-defined condition.

In some embodiments, like the AOI22 cell C62 of FIG. 7A, a functional cell may include upper patterns. Therefore, a relative location between a functional cell and tracks of an upper wiring layer may be fixed, and the location of a more appropriate filler cell may also be fixed. In some embodiments, the cell library D12 of FIG. 10 may include information indicating the location of a filler cell in properties of a cell (e.g., a name, etc.), and the semiconductor design tool may place a filler cell with reference to the information. Also, in some embodiments, a file referred to by the some embodiments for placing cells may include information that groups functional cells according to locations of a filler cell.

Figure 17:
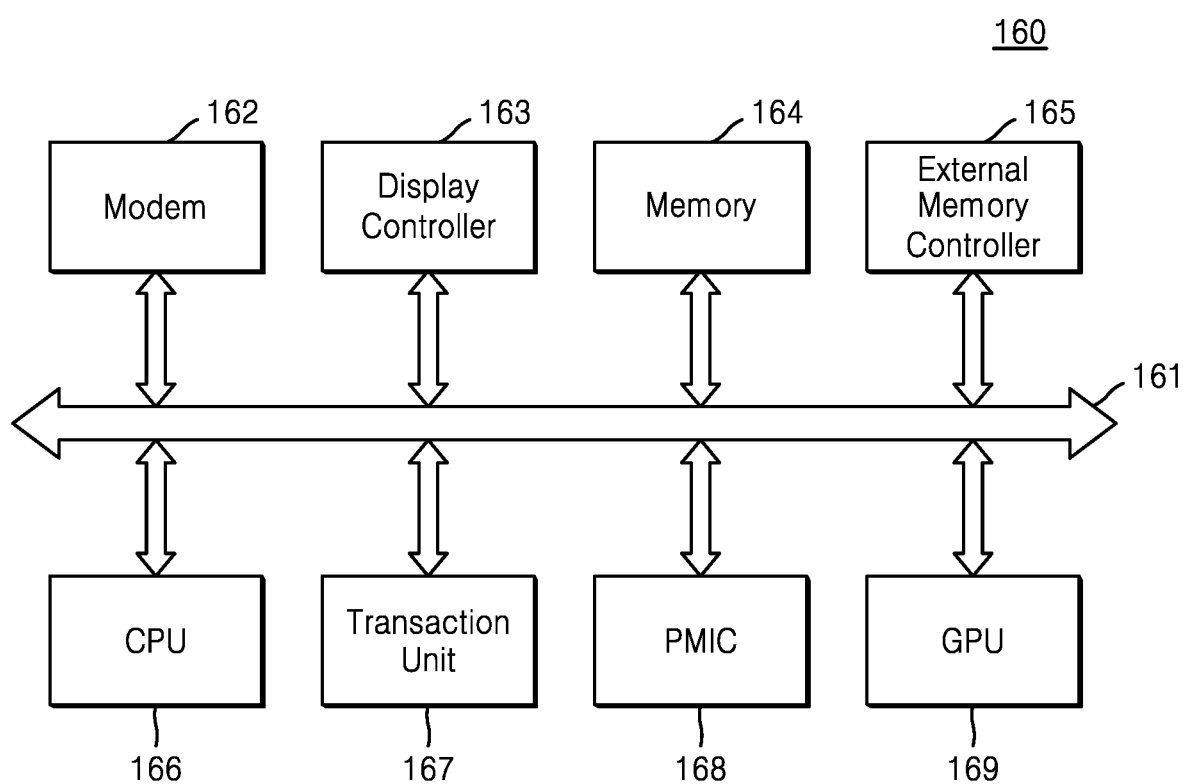
FIG. 17 is a block diagram showing a system-on-chip (SoC), according to an embodiment.

FIG. 17 is a block diagram showing a system-on-chip (SoC) 160, according to an embodiment. The SoC 160 is a semiconductor device and may include an integrated circuit according to an embodiment. The SoC 160 is an implementation of complex functional blocks like an intellectual property (IP) for performing various functions on one chip. The SoC 160 may be designed according to a method of designing an integrated circuit according to an embodiment. Therefore, the SoC 160 providing high performance and high efficiency based on reduced routing congestion may be implemented. Referring to FIG. 17, the SoC 160 may include a modem 162, a display controller 163, a memory 164, an external memory controller 165, a central processing unit (CPU) 166, a transaction unit 167, a power management integrated circuit (PMIC) 168, and a graphic processing unit (GPU) 169, wherein functional blocks of the SoC 160 may communicate with one another through a system bus 161.

The CPU 166 capable of controlling the operation of the SoC 160 at the highest level may control operations of the other functional blocks 162 to 169. The modem 162 may demodulate signals received from the outside of the SoC 160 or modulate signals generated inside the SoC 160 and transmit modulated signals to the outside. The external memory controller 165 may control operations for transmitting and receiving data to and from an external memory device connected to the SoC 160. For example, programs and/or data stored in an external memory device may be provided to the CPU 166 or the GPU 169 under the control of the external memory controller 165. The GPU 169 may execute program instructions related to graphics processing. The GPU 169 may receive graphics data through the external memory controller 165 or transmit graphics data processed by the GPU 169 to the outside of the SoC 160 through the external memory controller 165. The transaction unit 167 may monitor data transactions of functional blocks, and the PMIC 168 may control powers supplied to the functional blocks under the control of the transaction unit 167. The display controller 163 may control a display (or a display device) outside the SoC 160, thereby transmitting data generated inside the SoC 160 to the display. The memory 164 may include a non-volatile memory like an electrically erasable programmable read-only memory (EEPROM) and a flash memory or a volatile memory like a dynamic random access memory (DRAM) and a static random access memory (SRAM).

Figure 18:
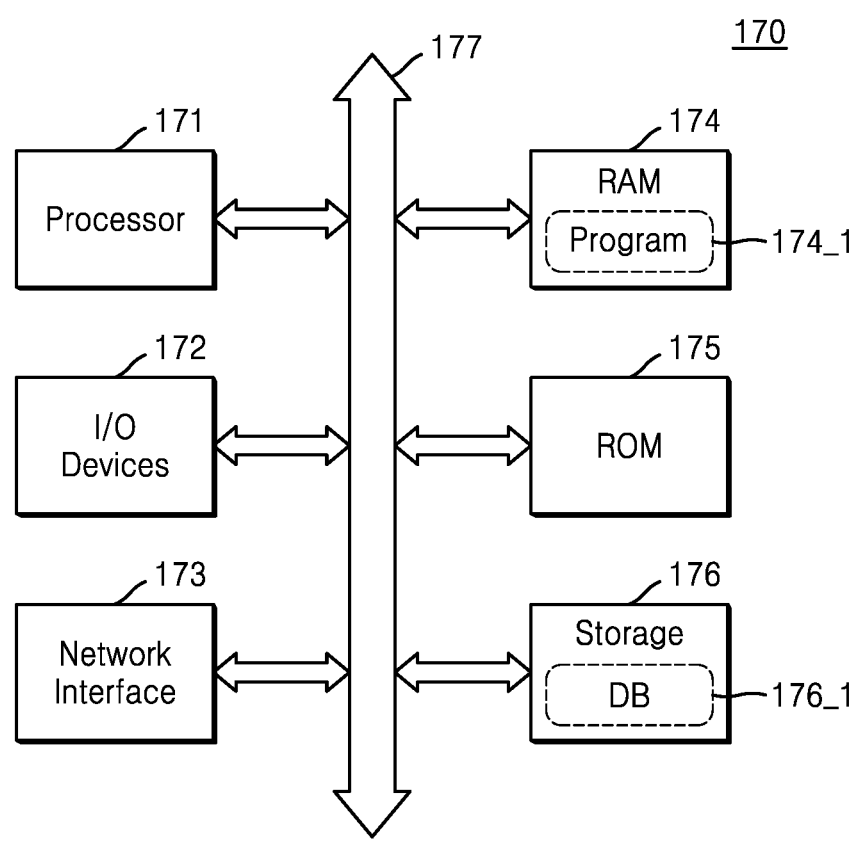
FIG. 18 is a block diagram showing a computing system including a memory storing a program, according to an embodiment.

FIG. 18 is a block diagram showing a computing system 170 including a memory storing a program, according to an example embodiment. At least some of operations included in a method of designing an integrated circuit according to embodiments (e.g., the method of FIG. 10) may be performed by the computing system (or a computer) 170.

The computing system 170 may be a stationary computing system like a desktop computer, a workstation, or a server or a portable computing system like a laptop computer. As shown in FIG. 18, the computing system 170 may include a processor 171, input/output devices 172, a network interface 173, a RAM 174, a ROM 175, and a storage device 176. The processor 171, the input/output devices 172, the network interface 173, the RAM 174, the ROM 175, and the storage device 176 may be connected to a bus 177 and may communicate with one another through the bus 177.

The processor 171 may be referred to as a processing unit and, for example, may include at least one core, e.g., a micro-processor, an application processor (AP), a digital signal processor (DSP), a graphics processing unit (GPU), etc., capable of executing an arbitrary instruction set (e.g., Intel Architecture-32 (IA-32), 64-bit extended IA-32, x86-64, PowerPC, Sparc, MIPS, ARM, IA-64, etc.). For example, the processor 171 may access a memory, that is, the RAM 174 or the ROM 175, through the bus 177 and may execute instructions stored in the RAM 174 or the ROM 175.

The RAM 174 may store a program 174_1 for a method of designing an integrated circuit according to an embodiment or at least a portion of the program 174_1, and the program 174_1 may instruct the processor 171 to perform at least some of operations included in the method of designing an integrated circuit, e.g., the method of FIG. 10. In other words, the program 174_1 may include a plurality of instructions that can be executed by the processor 171, and the instructions included in the program 174_1 may instruct the processor 171 to perform at least some of operations included in the flowchart of FIG. 10, for example.

The storage device 176 may not lose stored data even when power supplied to the computing system 170 is cut off. For example, the storage device 176 may include a non-volatile memory device or a storage medium like a magnetic tape, an optical disk, or a magnetic disk. Also, the storage device 176 may be detachable from the computing system 170. The storage device 176 may store the program 174_1 according to an embodiment, and, before the program 174_1 is executed by the processor 171, the program 174_1 or at least a part thereof may be loaded to the RAM 174. Alternatively, the storage device 176 may store a file written in a program language, and the program 174_1 generated from the file by a compiler or the like or at least a part of the program 174_1 may be loaded to the RAM 174. Also, as shown in FIG. 18, the storage device 176 may store a database 176_1, and the database 176_1 may include information needed for designing an integrated circuit, e.g., the cell library D12 and/or the design rules D14 of FIG. 10.

The storage device 176 may store data to be processed by the processor 171 or data processed by the processor 171. In other words, the processor 171 may generate data by processing data stored in the storage device 176 according to the program 174_1 and may store generated data in the storage device 176. For example, the storage device 176 may store the RTL data D11, the netlist D13, and/or the layout data D15 of FIG. 10.

The input/output devices 172 may include an input device like a keyboard and a pointing device and may include an output device like a display device and a printer. For example, through the input/output devices 172, a user may trigger execution of the program 174_1 through the processor 171, input the RTL data D11 and/or the netlist D13 of FIG. 10, or check the layout data D15 of FIG. 10.

The network interface 173 may provide access to a network outside the computing system 170. For example, a network may include a plurality of computing systems and communication links, and the communication links may include wired links, optical links, wireless links, or any other types of links.

While the inventive concept has been particularly shown and described with reference to embodiments thereof, it will be understood that various changes in form and details may be made therein without departing from the spirit and scope of the following claims.

What is claimed is:

1. An integrated circuit comprising:
   a first cell comprising a first lower pattern extending in a first direction along a first track in a first wiring layer; and
   a second cell comprising a second lower pattern that extends in the first direction along the first track in the first wiring layer, and is apart from the first lower pattern by at least a minimum space allowed by a design rule as a space between two lower patterns extended in a same track on the first wiring layer,
   wherein the first lower pattern corresponds to a pin of the first cell,
   wherein a distance between the second lower pattern and a boundary between the first cell and the second cell is greater than a distance between the first lower pattern and the boundary, and
   wherein the first cell and the second cell are placed adjacent to each other in a same row extending in the first direction.

2. The integrated circuit of claim 1, wherein the second lower pattern corresponds to a pin of the second cell.

3. The integrated circuit of claim 1, wherein the first lower pattern is terminated at the boundary.

4. The integrated circuit of claim 1, wherein the first cell further comprises a third lower pattern extending in the first direction along a second track in the first wiring layer, wherein the second cell further comprises a fourth lower pattern that extends in the first direction along the second track in the first wiring layer, and is apart from the third lower pattern by the minimum space or farther, wherein the fourth lower pattern corresponds to a pin of the second cell, and wherein the third lower pattern is farther apart from the boundary than the fourth lower pattern is.

5. The integrated circuit of claim 4, wherein at least one of the first track and the second track includes an outermost track of tracks in the first cell.

6. The integrated circuit of claim 1, wherein the first cell further comprises at least one gate electrode extending in a second direction perpendicular to the first direction with a first pitch, wherein the integrated circuit comprises a plurality of upper patterns extending over the first cell in the second direction with a second pitch in a second wiring layer, and wherein the second pitch is less than the first pitch.

7. The integrated circuit of claim 6, wherein the plurality of upper patterns comprise a first upper pattern aligned with a first gate electrode of the at least one gate electrode.

8. The integrated circuit of claim 7, wherein the plurality of upper patterns comprise a second upper pattern adjacent to the first gate electrode, and wherein the integrated circuit further comprises a first via connecting the first lower pattern with the second upper pattern.

9. The integrated circuit of claim 6, wherein the first cell further comprises at least one contact extending in the second direction between the at least one gate electrode, and wherein the plurality upper patterns comprise a third upper pattern aligned with one of the at least one contact.

10. The integrated circuit of claim 9, wherein the plurality of upper patterns comprises a fourth upper pattern adjacent to the third upper pattern and a fifth upper pattern adjacent to the fourth upper pattern, and wherein the integrated circuit further comprises a second via interconnecting the first lower pattern with the fifth upper pattern.

11. An integrated circuit comprising:

a first cell comprising a first lower pattern and a second lower pattern extending in a first direction along a first track and a second track in a first wiring layer, respectively; and a second cell comprising a third lower pattern and a fourth lower pattern extending in the first direction along the first track and the second track in the first wiring layer, respectively, wherein the first lower pattern is apart from the third lower pattern by at least a minimum space allowed by a design rule as a space between two lower patterns extended in a same track on the first wiring layer, and is apart from a boundary between the first cell and the second cell by a first distance or farther, wherein the second lower pattern is apart from the fourth lower pattern by the minimum space or farther, and is apart from the boundary by a second distance or farther, wherein the first distance is different from the second distance wherein the first cell and the second cell are placed adjacent to each other in a same row extending in the first direction.

12. The integrated circuit of claim 11, wherein the first distance is smaller than the second distance, wherein the first lower pattern corresponds to a pin of the first cell, and wherein the fourth lower pattern corresponds to a pin of the second cell.

13. The integrated circuit of claim 12, wherein the first lower pattern and the fourth lower pattern are terminated at the boundary.

14. The integrated circuit of claim 12, wherein the second lower pattern corresponds to a pin of the first cell, and wherein the third lower pattern corresponds to a pin of the second cell.

15. A method of designing an integrated circuit, the method comprising:

obtaining input data that defines a plurality of cells and connections between the plurality of cells;

placing the plurality of cells based on the input data;

routing a plurality of pins of the plurality of cells based on the input data; and generating output data that defines a layout of the integrated circuit, wherein the routing the pins comprises:

extending a first lower pattern, which corresponds to a pin of a first cell and extends in a first direction in a first wiring layer;

disposing a via at one of a plurality of pin access points comprising a pin access point of an extended portion of the first lower pattern; and generating a first upper pattern, which is connected to the via and extends in a second direction perpendicular to the first direction in a second wiring layer.

16. The method of claim 15, wherein the extending the first lower pattern comprises:

merging a second lower pattern, which is included in a second cell adjacent to the first cell and extends in the first direction along the same track as the first lower pattern in the first wiring layer, with the first lower pattern; and generating a cut of the first wiring layer at the merged pattern.

17. The method of claim 15, wherein the placing the plurality of cells comprises:

disposing the first cell; and placing a filler cell to be adjacent to the first cell, wherein the extending the first lower pattern comprises extending the first lower pattern into the filler cell.

18. The method of claim 17, wherein the first cell comprises at least one gate electrode extending in the second direction with a first pitch, wherein a plurality of upper patterns extend in the second direction with a second pitch smaller than the first pitch in the second wiring layer, and wherein the placing the filler cell comprises placing a filler cell providing more pin access points at the extended portion of the first lower pattern from among two filler cells which are possible to be placed at both sides of the first cell.

19. The method of claim 17, wherein the first cell comprises a second upper pattern extending in the second direction in the second wiring layer, and wherein the placing the filler cell comprises identifying a property of the filler cell, and placing the filler cell on one of both sides of the first cell based on the property.

20. The method of claim 15, further comprising:
generating output data that defines the layout of the integrated circuit;
manufacturing a mask based on the output data; and
manufacturing the integrated circuit based on the mask.

* * * * *